United States Patent
King et al.

(10) Patent No.: US 10,658,380 B2
(45) Date of Patent: May 19, 2020

(54) FORMATION OF TERMINATION STRUCTURES IN STACKED MEMORY ARRAYS

(71) Applicant: Micron Technology, Inc., Boise, ID (US)

(72) Inventors: Matthew J. King, Boise, ID (US); Anilkumar Chandolu, Boise, ID (US); Indra V. Chary, Boise, ID (US); Darwin A. Clampitt, Wilder, ID (US); Gordon Haller, Boise, ID (US); Thomas George, Boise, ID (US); Brett D. Lowe, Boise, ID (US); David A. Daycock, Boise, ID (US)

(73) Assignee: Micron Technology, Inc., Boise, ID (US)

(*) Notice: Subject to any disclaimer, the term of this patent is extended or adjusted under 35 U.S.C. 154(b) by 31 days.

(21) Appl. No.: 16/160,146

(22) Filed: Oct. 15, 2018

(65) Prior Publication Data
US 2020/0119040 A1 Apr. 16, 2020

(51) Int. Cl.
*H01L 27/115* (2017.01)
*H01L 27/11582* (2017.01)
(Continued)

(52) U.S. Cl.
CPC .... *H01L 27/11582* (2013.01); *H01L 27/1157* (2013.01); *H01L 27/11524* (2013.01);
(Continued)

(58) Field of Classification Search
CPC ........... H01L 27/11582; H01L 27/1157; H01L 27/11556; H01L 27/11565; H01L 23/5226;
(Continued)

(56) References Cited

U.S. PATENT DOCUMENTS 9,230,974 B1 * 1/2016 Pachamuthu ....... H01L 27/1157
9,773,805 B1 9/2017 Li et al.
(Continued)

OTHER PUBLICATIONS

U.S. Appl. No. 16/029,144, entitled "Integrated Assemblies Having Thicker Semiconductor Material Along One Region of a Conductive Structure Than Along Another Region, and Methods of Forming Integrated Assemblies", filed Jul. 6, 2018, (63 pgs.).
(Continued)

*Primary Examiner* — Jaehwan Oh
(74) *Attorney, Agent, or Firm* — Brooks, Cameron & Huebsch, PLLC

(57) ABSTRACT

In an example, a method of forming a stacked memory array includes forming a stack of alternating first and second dielectrics, forming a termination structure through the stack, the termination structure comprising a dielectric liner around a conductor, forming a set of contacts concurrently with forming the termination structure, forming a third dielectric over an upper surface of the stack and an upper surface of the termination structure, forming a first opening through the third dielectric and the stack between first and second groups of semiconductor structures so that the first opening exposes an upper surface of the conductor, and removing the conductor from the termination structure to form a second opening lined with the dielectric liner. In some examples, the dielectric liner can include a rectangular or a triangular tab or a pair of prongs that can have a rectangular profile or that can be tapered.

24 Claims, 21 Drawing Sheets

(51) Int. Cl.
*H01L 27/1157* (2017.01)
*H01L 27/11526* (2017.01)
*H01L 27/11556* (2017.01)
*H01L 27/11524* (2017.01)
*H01L 27/11573* (2017.01)

(52) U.S. Cl.
CPC .. *H01L 27/11526* (2013.01); *H01L 27/11556* (2013.01); *H01L 27/11573* (2013.01)

(58) Field of Classification Search
CPC ......... H01L 27/11573; H01L 29/66833; H01L 27/11524; H01L 29/7926
See application file for complete search history.

(56) References Cited

U.S. PATENT DOCUMENTS

| | | |
|---|---|---|
| 2012/0208347 A1 | 8/2012 | Hwang et al. |
| 2014/0014889 A1* | 1/2014 | Shim ................. H01L 29/7827 257/1 |
| 2015/0318301 A1* | 11/2015 | Lee ..................... H01L 29/7926 257/324 |
| 2016/0268302 A1* | 9/2016 | Lee ................. H01L 27/11582 |
| 2017/0207226 A1* | 7/2017 | Lee ......................... H01L 28/00 |
| 2017/0250108 A1 | 8/2017 | Mathew et al. |
| 2017/0278859 A1* | 9/2017 | Sharangpani ..... H01L 27/11573 |

OTHER PUBLICATIONS

U.S. Appl. No. 15/992,959, entitled "Arrays of Elevationally-Extending Strings of Memory Cells and Methods of Forming an Array of Elevationally-Extending Strings of Memory Cells", filed May 30, 2018, (41 pgs.).

U.S. Appl. No. 15/710,432, entitled "Methods Used in Forming an Array of Elevationally-Extending Transistors" filed Sep. 20, 2017, (56 pgs.).

* cited by examiner

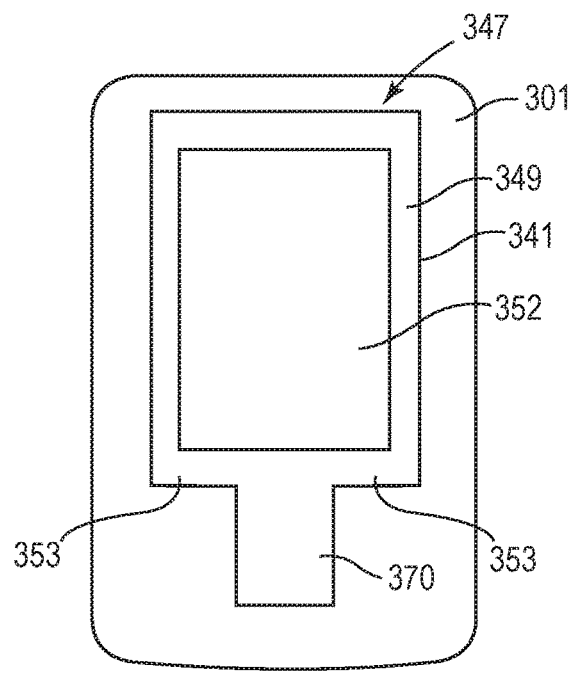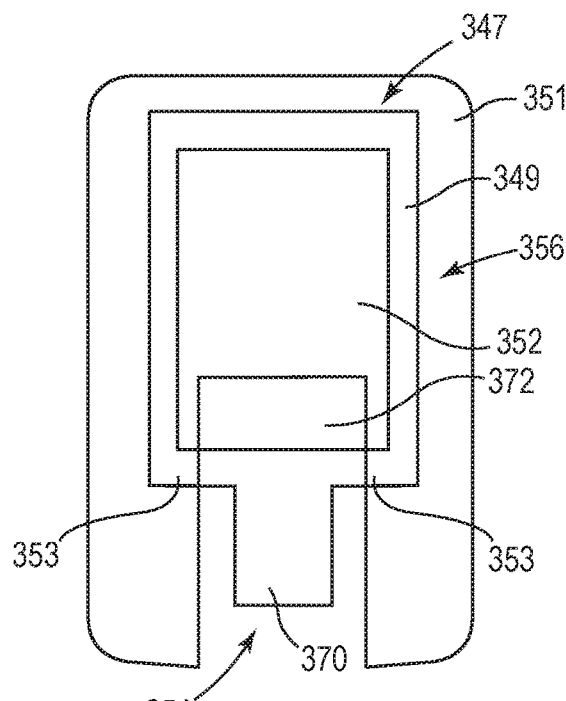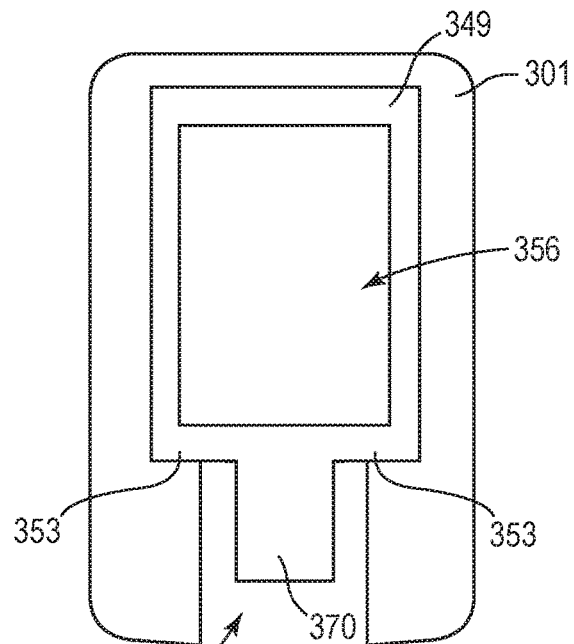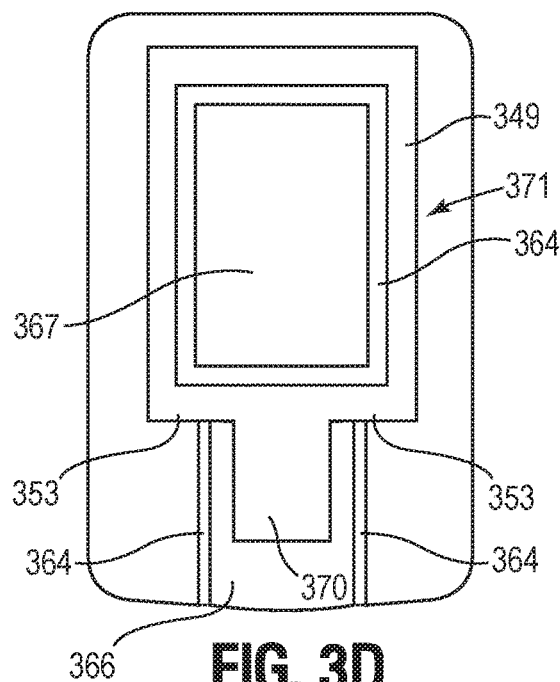

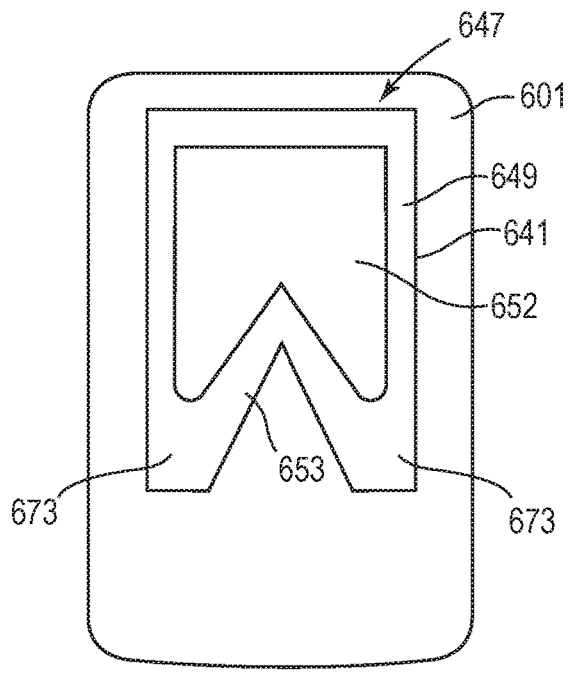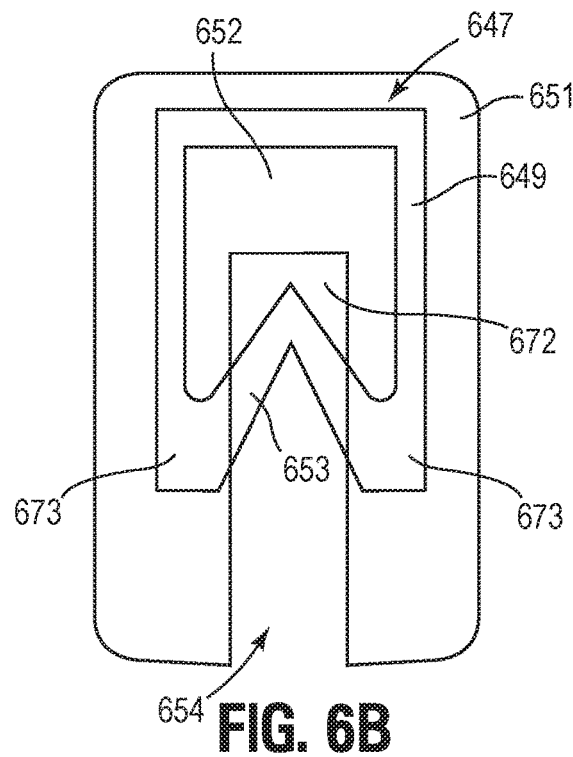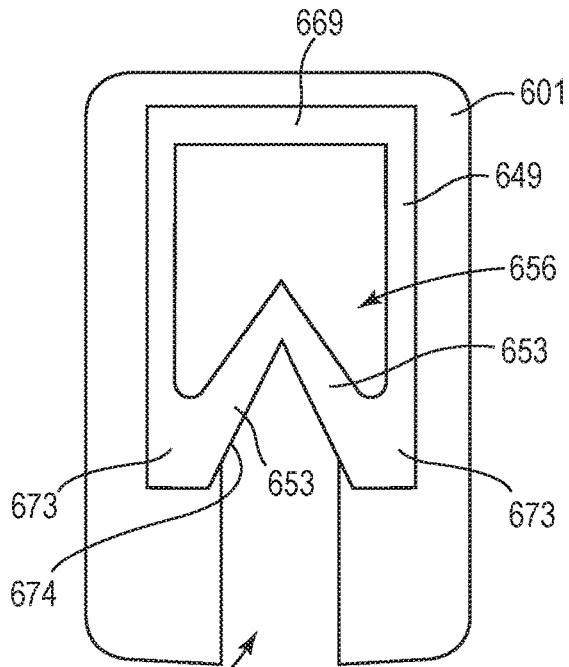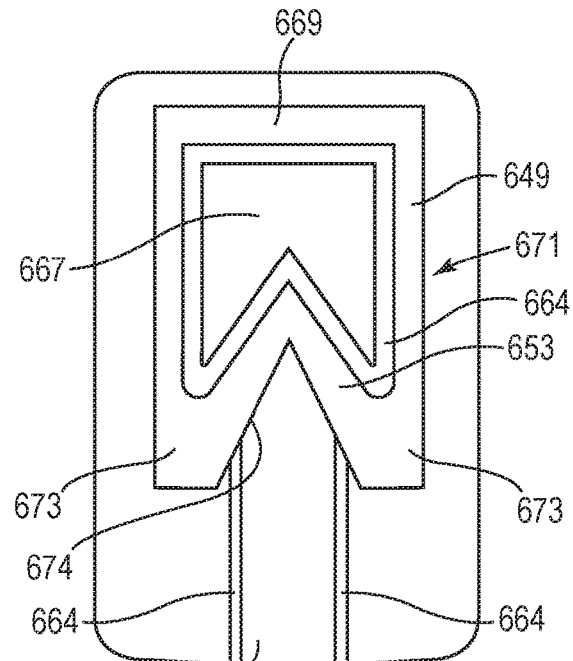

US 10,658,380 B2

FORMATION OF TERMINATION STRUCTURES IN STACKED MEMORY ARRAYS

TECHNICAL FIELD

The present disclosure relates generally to memory arrays and their formation, and more particularly, to the formation of termination structures in stacked memory arrays.

BACKGROUND

Memory devices are typically provided as internal, semiconductor, integrated circuits in computers or other electronic devices. There are many different types of memory, including random-access memory (RAM), read only memory (ROM), dynamic random access memory (DRAM), synchronous dynamic random access memory (SDRAM), resistive memory (e.g., RRAM), and Flash memory, among others.

Memory devices can be utilized as volatile and non-volatile data storage for a wide range of electronic applications. Volatile memory may require power to maintain its data, whereas non-volatile memory may provide persistent data by retaining stored data when not powered. Flash memory, which is just one type of non-volatile memory, can use a one-transistor memory cells that allow for high memory densities, high reliability, and low power consumption. Non-volatile memory may be used in, for example, personal computers, portable memory sticks, solid state drives (SSDs), digital cameras, cellular telephones, portable music players such as MP3 players, movie players, and other electronic devices.

Memory devices can have arrays of memory cells. Memory arrays can include groups of memory cells, such as blocks, sub-blocks, strings, etc. In some examples, a memory array can be a stacked memory array that can be referred to as a three-dimensional (3D) memory array. The memory cells at a common location (e.g., at a common vertical level) in a stacked memory array, for example, may form a tier of memory cells. The memory cells in each tier can be commonly coupled to a common access line, such as a word line. In some examples, a group of memory cells can include memory cells from different tiers coupled in series to form a string of series coupled memory cells (e.g., a NAND string) between a select transistor coupled to a source and a select transistor coupled to a data line, such as a bit line.

In some examples, the formation of stacked memory arrays can include a replacement gate process. After semiconductor structures (e.g., semiconductor pillars) are formed through a stack of alternating dielectrics, a replacement gate process can be used to remove dielectrics from the stack at levels at which memory cells are to be formed adjacent to the semiconductor structures and to form conductive access lines (e.g., metal access lines) in place of the removed dielectrics. In various examples, an opening (e.g., a slot or slit) can be formed through the stack to provide access to the various levels in the stack in order to remove selected dielectric material layers (e.g., via an etchant) and replace them with levels of conductive material (e.g., a metal) that can serve as the access lines.

BRIEF DESCRIPTION OF THE DRAWINGS

FIGS. 3A to 3D are various views corresponding to particular stages of processing associated with forming a stacked memory array in accordance with a number of embodiments of the present disclosure.

FIGS. 6A to 6D are various views corresponding to particular stages of processing associated with forming a stacked memory array in accordance with a number of embodiments of the present disclosure.

DETAILED DESCRIPTION

Stacked memory arrays and their formation are disclosed herein. In an example method to form a stacked memory array, a termination structure and contacts can be formed concurrently through a stack of alternating first and second dielectrics. For example, the first dielectrics can be at levels in the stack at which memory cells are to be formed adjacent to semiconductor structures passing through the stack. An additional dielectric can be formed over an upper surface of the stack and an upper surface of the termination structure. The termination structure can include a dielectric liner around a conductor. An opening can be formed through the additional dielectric and the stack between groups of the semiconductor structures so that the first opening exposes an upper surface of the conductor. For example, the opening can provide access to the stack during subsequent processing that can occur during a replacement gate process. The conductor can be removed from the termination structure to form an additional opening lined with the dielectric liner.

In previous approaches, the openings (e.g., slots) used to access the alternating dielectrics can be formed (e.g., concurrently) by a single etch through the dielectric stack in a first direction and in a second (e.g., transverse) direction, which facilitates electrical isolation of blocks of memory cells from each other after the openings are filled with a dielectric. The transverse etch through the stack forms T-intersections that can be difficult to form and that can have various drawbacks. Various embodiments of the present disclosure can utilize termination structures that can help isolate the blocks of memory cells from each other without forming T-intersections, thereby avoiding the difficulties and drawbacks associated therewith. In some examples, termination structures can be specifically tailored to help isolate the blocks of memory cells from each other. For example, termination structures can have tabs, such as tabs having rectangular or triangular profiles, or prongs, such as tapered prongs or prongs having rectangular profiles.

Figure 1:
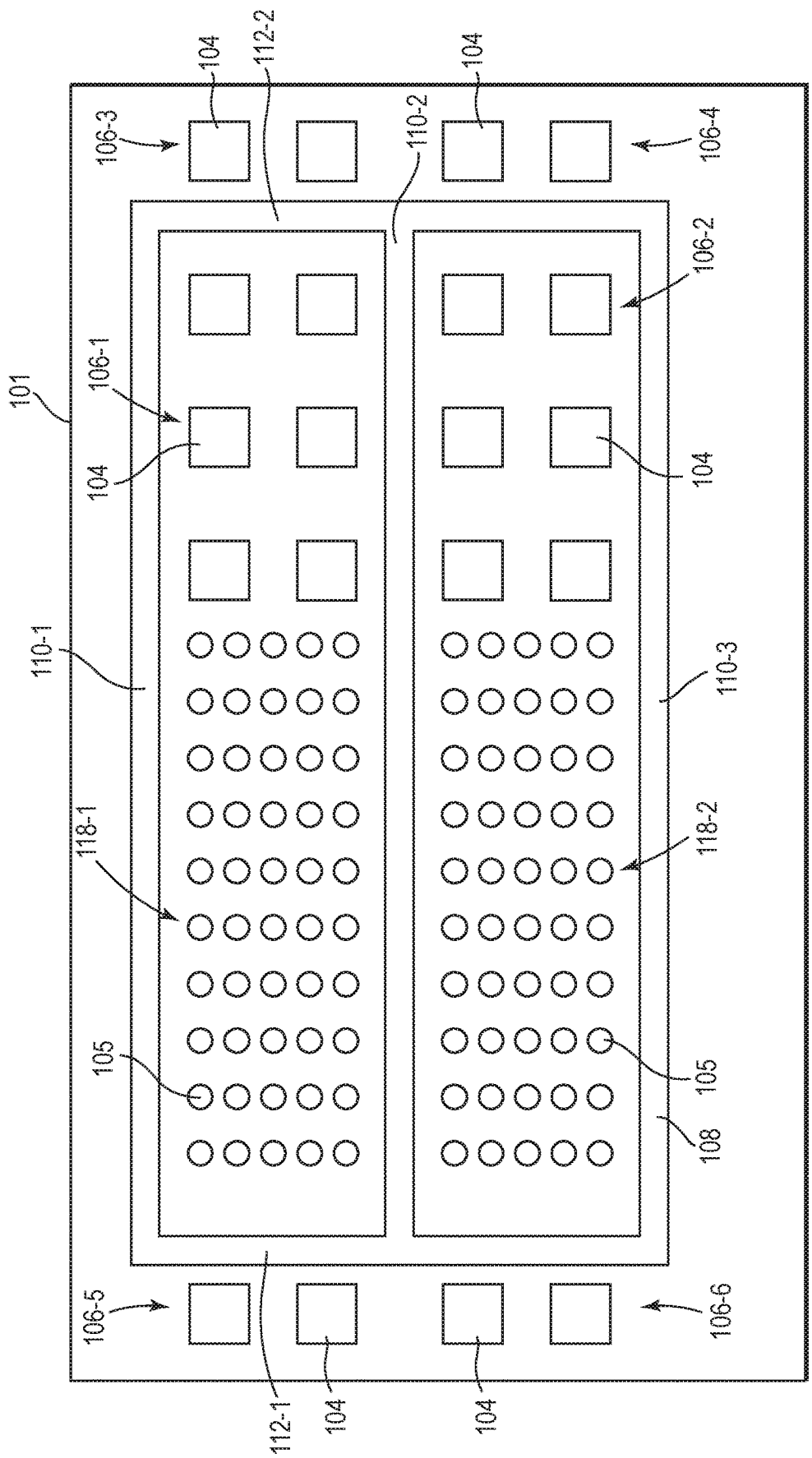
FIG. 1 is a top view at a particular processing stage associated with forming a stacked memory array, according to the background art.

FIG. 1 is a top view at a particular processing stage associated with forming a stacked memory array, according to the background art. In FIG. 1, a stack 101 of alternating dielectrics, such as nitride alternating with oxide, includes sets 106-1 to 106-6 of contacts 104 passing through stack 101 and groups 118-1 and 118-2 of semiconductor structures 105 passing through stack 101.

Contacts 104 can be formed after semiconductor structures 105 are formed. In some examples, memory cells can be partially formed adjacent to semiconductor structures 105 (e.g., at levels in stack 101 containing the nitride) before contacts 104 are formed.

An opening 108 is formed through stack 101 after contacts 104 are formed. In some examples, a removal material selective to nitride can be supplied through opening 108 to remove the nitride, leaving the oxide. Contacts 104 can be electrical contacts and/or support contacts. For example, the electrical contacts can be coupled to routing circuitry of the array. The electrical and support contacts can provide support that acts to stabilize and restrict movement of stack 101 during and after the removal of the nitride.

In some examples, the partially formed memory cells can be completed by accessing the memory cells through opening 108. A conductor, such as metal (e.g. tungsten), can be supplied though opening 108 to form lines, such as access lines that can be coupled to the memory cells and that can extend into the regions including sets 106-1 and 106-2 of contacts 104 so that the contacts 104 of sets 106-1 and 106-2 pass through oxide alternating with metal, for example. For instance, access lines corresponding to group 118-1 can extend into the region including set 106-1, and access lines corresponding to group 118-2 can extend into the region including set 106-2. In some examples, formation of opening 108, removal of the nitride, completing the memory cells, and forming the access lines can be formed as part of a replacement gate process.

A dielectric can be formed in opening 108 to electrically isolate the access lines corresponding to group 118-1 from access lines corresponding to group 118-2. Opening 108 can include segments 110-1 to 110-3 and segments 112-1 and 112-2 that are transverse to segments 110-1 to 110-3. For example, segments 110-1 to 110-3 and segment 112-1 form respective T-intersections, and segments 110-1 to 110-3 and segment 112-2 form respective T-intersections.

In some examples, opening 108 can be formed during a single process step (e.g., during a single etch) that can form the segments 110-1 to 110-3 and segments 112-1 and 112-2 concurrently. However, as an example, the T-intersections can be formed by performing a first etch through the stack 101 to form segments 110-1 to 110-3 and a second etch through the stack 101 to form segments 112-1 and 112-2. Forming such T-intersections can be difficult and can have various drawbacks. For instance, forming segments 112-1 and 112-2 can result in over etching or under etching, which can result in inadequate separation of the groups 118-1 and 118-2 or can prevent adequate electrical isolation.

Segment 112-1 can form a continuous space (e.g., discontinuity) in stack 101 that can decouple the region having sets 106-5 and 106-6 from the ends of groups 118-1 and 118-2. Segment 112-2 can form a continuous space in stack 101 that can decouple the region having sets 106-3 and 106-4 from the ends of sets 106-1 and 106-2. In some examples, stress in stack 101 that can occur as a result of processing prior to the formation of opening 108 can be released during the formation of opening 108, especially as a result of the formation segments 112-1 and 112-2. For example, semiconductor structures 105 can move after opening 108 is formed due to the stress release, especially in a direction parallel to segments 110 in the regions adjacent to segments 112-1 and 112-2, as a result of the discontinuities caused by segments 112-1 and 112-2. Moreover, the discontinuities can result in additional movement during the removal of the nitride and/or during the formation of the access lines.

The movement can make it difficult to align data line contacts with semiconductor structures 105, such as to couple data lines to the semiconductor structures 105. In some instances, the movement of semiconductor structures 105 can be relatively large at and near the ends of the ends of groups 118-1 and 118-2 and relatively little away from the ends. As such, the memory cells adjacent to the semiconductor structures 105 at and near the ends of groups 118-1 and 118-2 can be "dummy" memory cells. However, this can reduce the total number of memory cells available for data storage.

Figure 2A:
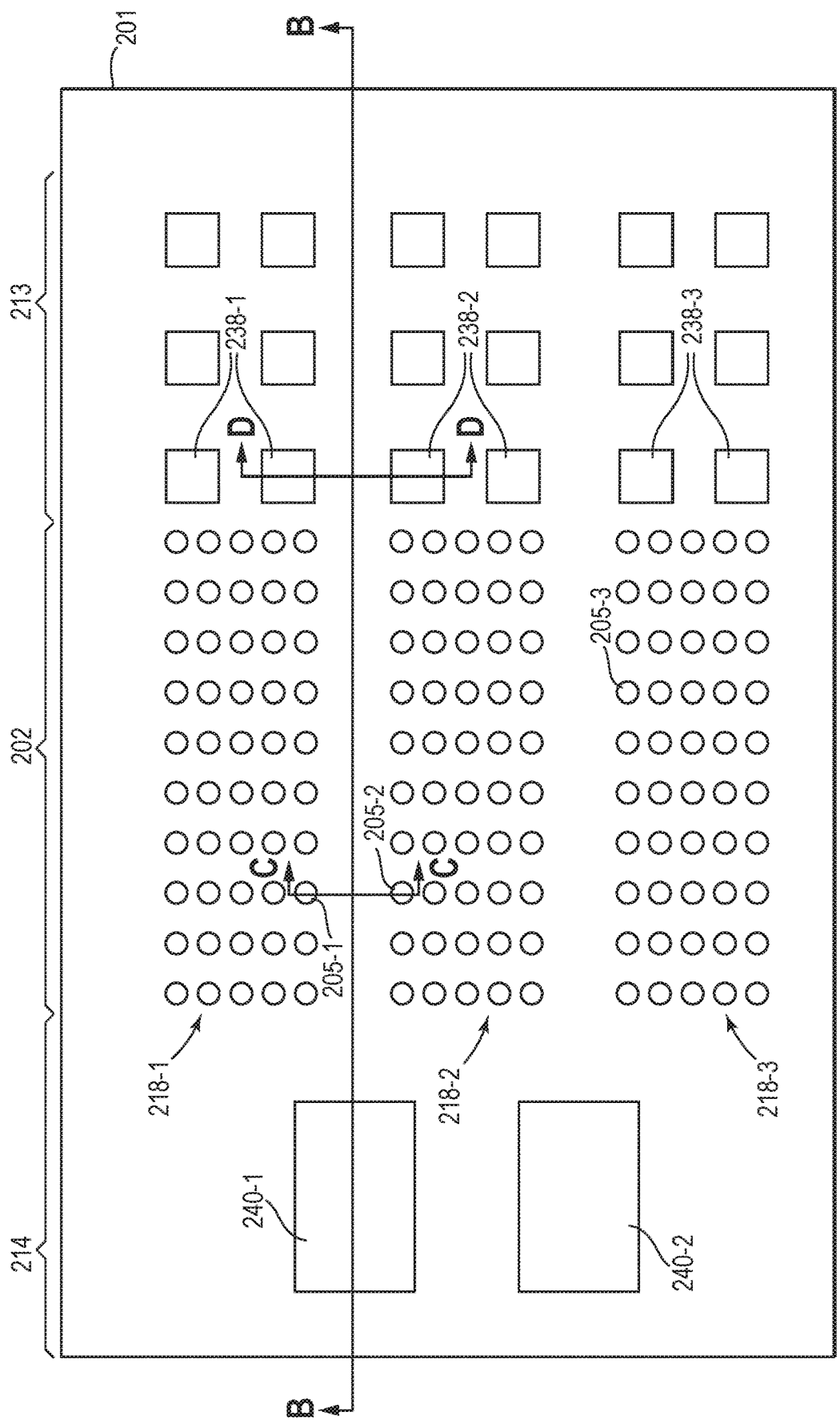
FIGS. 2A to 2S are various views corresponding to particular stages of processing associated with forming a stacked memory array in accordance with a number of embodiments of the present disclosure.
Figure 2B:
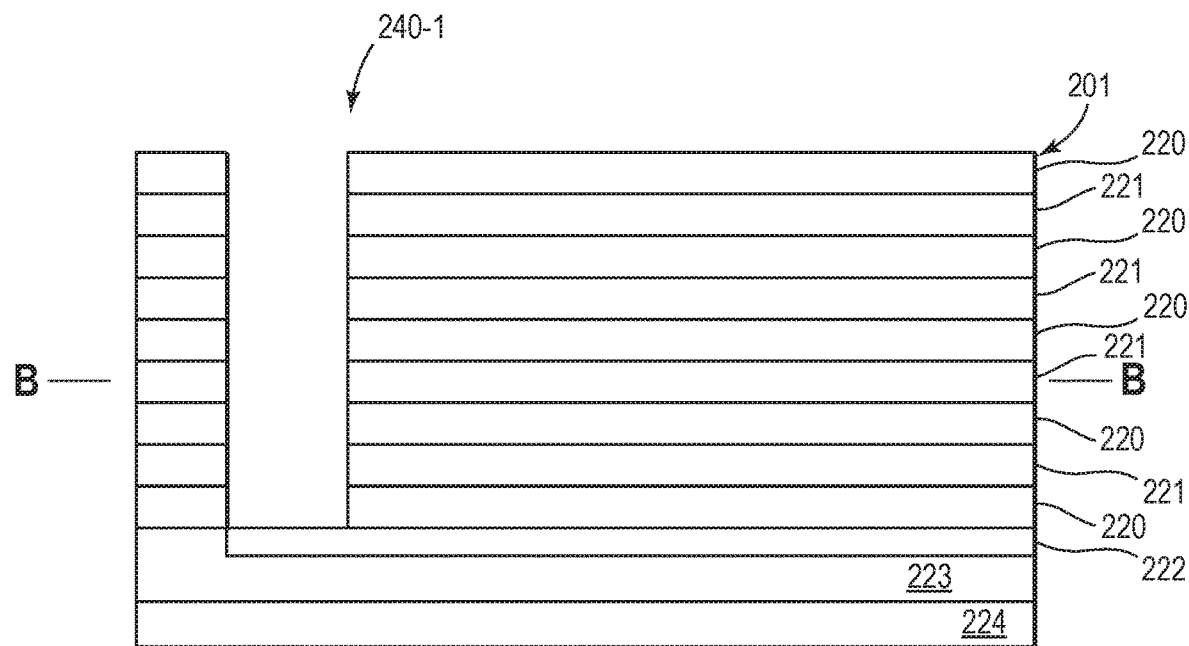
Figure 2C:
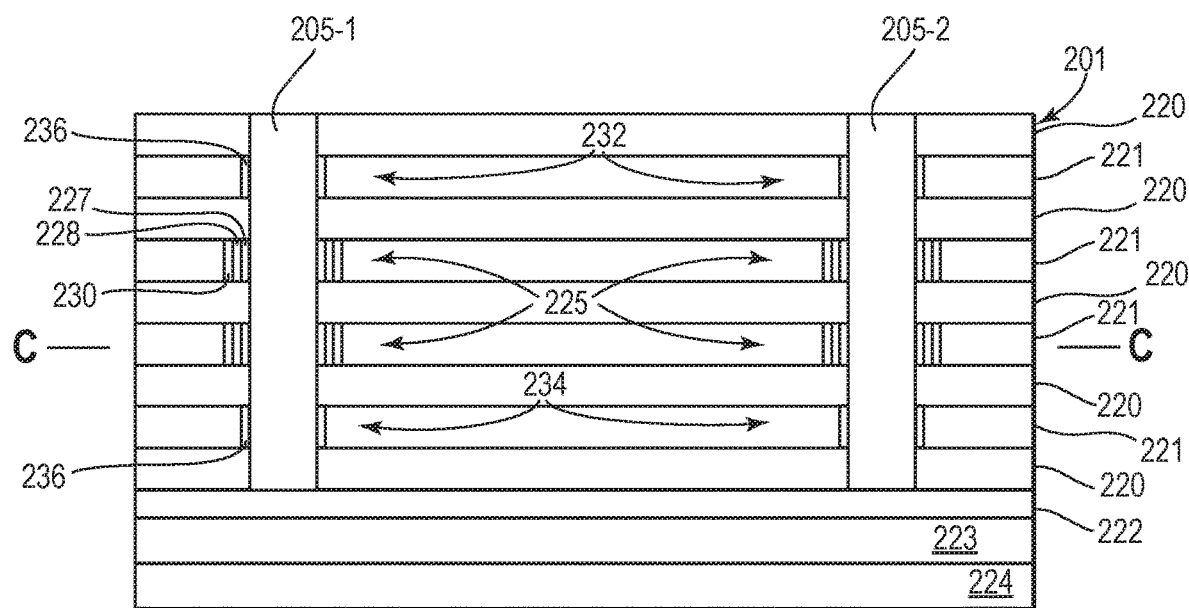
Figure 2D:
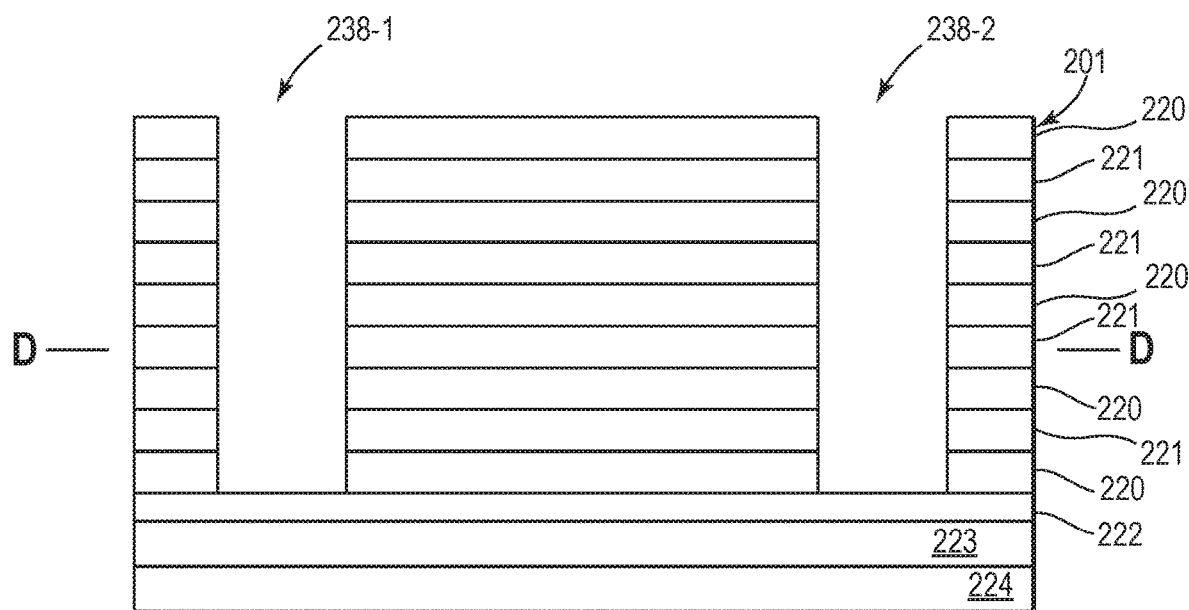

FIG. 2A is a top view corresponding to a particular stage of processing associated with forming a stacked memory array in accordance with a number of embodiments of the present disclosure. In some examples, the array can be a three-dimensional NAND memory array. FIG. 2B is a cross-section viewed along line B-B in FIG. 2A during the processing stage corresponding to FIG. 2A in accordance with a number of embodiments of the present disclosure. FIG. 2C is a cross-section viewed along line C-C in FIG. 2A during the processing stage corresponding to FIG. 2A in accordance with a number of embodiments of the present disclosure. FIG. 2D is a cross-section viewed along line D-D in FIG. 2A during the processing stage corresponding to FIG. 2A in accordance with a number of embodiments of the present disclosure. FIGS. 2A to 2D can correspond to a processing stage that can occur after a number of processing stages have occurred. In some examples, a processing stage can include a number of steps that can have a number of sub-steps.

A group 218-1 of semiconductor structures 205-1 passes through a region 202 of a stack 201 of alternating dielectrics 220 and 221 A group 218-2 of semiconductor structures 205-2 passes through region 202, and a group 218-3 of semiconductor structures 205-3 passes through region 202. In some examples, groups 218-1 to 218-3 can correspond to blocks of memory cells that are to be formed in region 202, and region 202 can be referred to as a memory-cell region. For example, a block of memory cells can refer to a group of memory cells that is commonly erased.

Stack 201 can be formed over a semiconductor 223. In some examples, conductive plugs, such as metal plugs (e.g., tungsten plugs), can be formed in portions of semiconductor 223, as shown in FIGS. 2B to 2D for a metal plug 222. In some examples, semiconductor 223 can be formed over a metal silicide 224, such as tungsten silicide.

Semiconductor structures 205-1 to 205-3 and semiconductor 223 can be polysilicon, silicon conductively doped to have a p-type conductivity (e.g., single crystal p⁻ silicon), or the like. Dielectrics 220 can be oxide, and dielectrics 221 can be nitride.

In some examples, memory cells 225 can be partially formed adjacent to each semiconductor structure 205 at levels of stack 201 having dielectrics 221. For example, as shown in FIG. 2C, a tunnel dielectric 227 (e.g., tunnel oxide) of a memory cell 225 can be formed adjacent to a semiconductor structure 205; a charge storage structure 228 (e.g., a charge trap, floating gate, etc.) can be formed adjacent to the tunnel dielectric 227; and a blocking dielectric 230 (e.g., oxide) can be formed adjacent to the charge storage structure 228. A respective dielectric 221 can be adjacent to a respective blocking dielectric 230. In some examples, tunnel dielectric 227, charge storage structure 228, and blocking dielectric 230 can wrap completely around (e.g., completely surround) the corresponding semiconductor structure 205.

In some examples, as shown in FIG. 2C, a select transistor 232 can be partially formed adjacent to each semiconductor structure 205 at a level of stack 201 having an uppermost dielectric 221, and a select transistor 234 can be partially formed adjacent to each semiconductor structure 205 at a level of stack 201 having a lowermost dielectric 221. For example, a gate dielectric 236 (e.g., gate oxide) of select transistors 232 and 234 can be formed adjacent to each semiconductor structure 205. Respective dielectrics 221 can be adjacent to the respective gate dielectrics 236. In some examples, gate dielectric 236 can wrap completely around the corresponding semiconductor structure 225. Note that semiconductor structures 205 can be formed prior to the processing stage depicted in FIGS. 2A to 2D, and select transistors 232 and 234 and memory cells 225 can be partially formed prior to the processing stage depicted in FIGS. 2A to 2D.

During the processing stage corresponding to FIGS. 2A to 2D, sets of openings 238-1 to 238-3, such as contact openings, are formed (e.g., etched) through stack 201 in a region 213, such as a contact region, of stack 201, stopping at an upper surface of a dielectric plug 222. Openings 240 (e.g., openings 240-1 and 240-2), such as termination openings, are formed (e.g., etched) through stack 201 concurrently with forming openings 238-1 to 238-3, stopping at an upper surface of a dielectric plug 222. For example, openings 240-1 and 214-2 can be formed through stack 201 in a region 214 of stack 201 adjacent to region 202. Region 214 can be referred to as a non-memory-cell region, for example, in that memory cells might not be formed there.

Note that the portions of region 214 that remain after forming openings 240, such as the portion between openings 214-1 and 240-2, couple region 214 to region 202. This avoids the continuous discontinuity in the stack 101 resulting from segment 112-1 in FIG. 1. For example, the coupling can reduce the amount of movement of semiconductors structures 205 associated with the formation of openings 240 relative to the movement of semiconductor structures 105 associated with the formation of segment 112-1.

In some examples, stack 201 can include a stair-step structure (not shown in FIG. 2A) at either end of stack 201. For example, a stair-step structure can be adjacent to region 214. Respective steps of the stair-step structure can be at different levels in stack 201. Each step of the stair-step structure can include a dielectric 221 over a dielectric 220, for example.

Figure 2E:
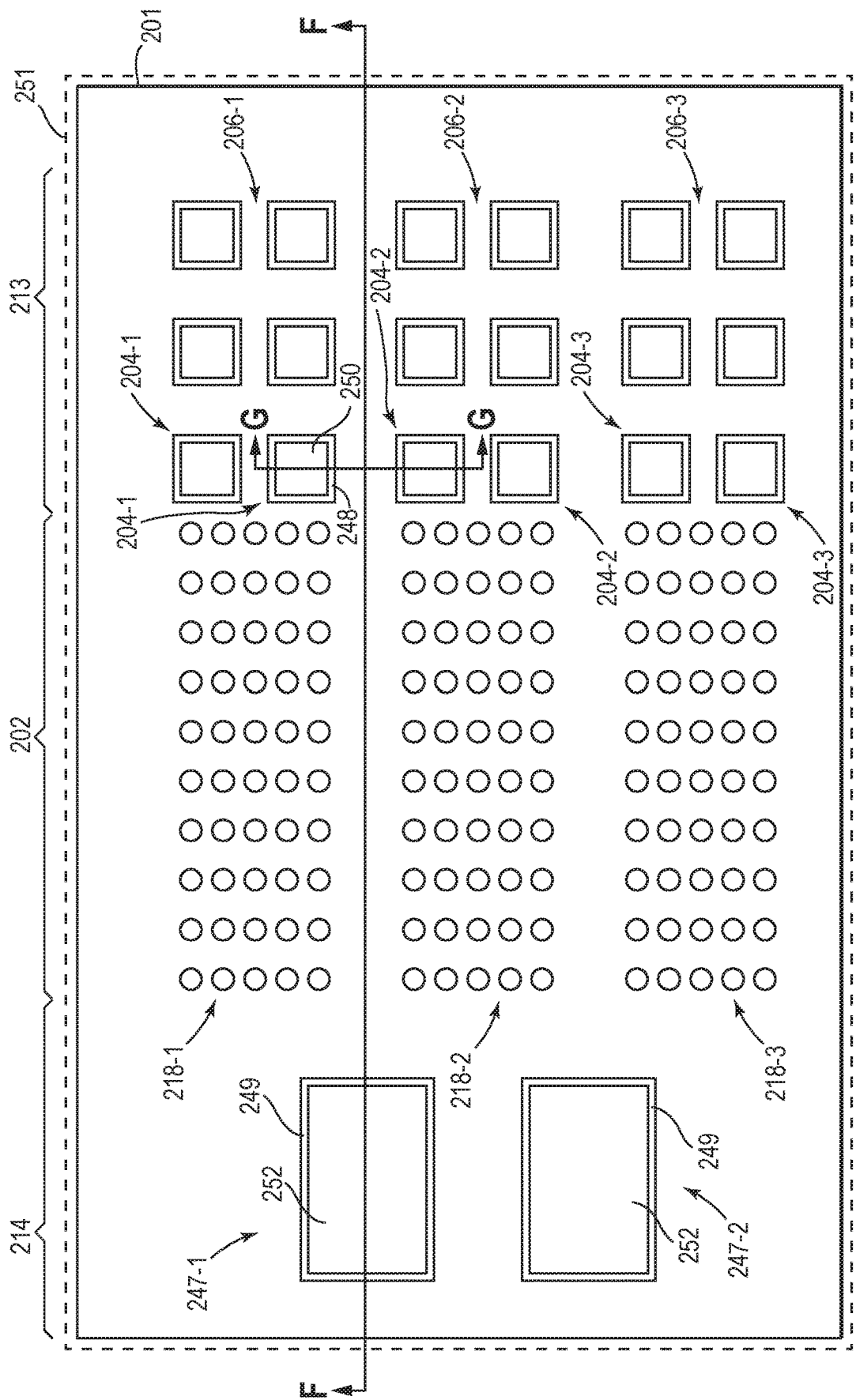
Figure 2F:
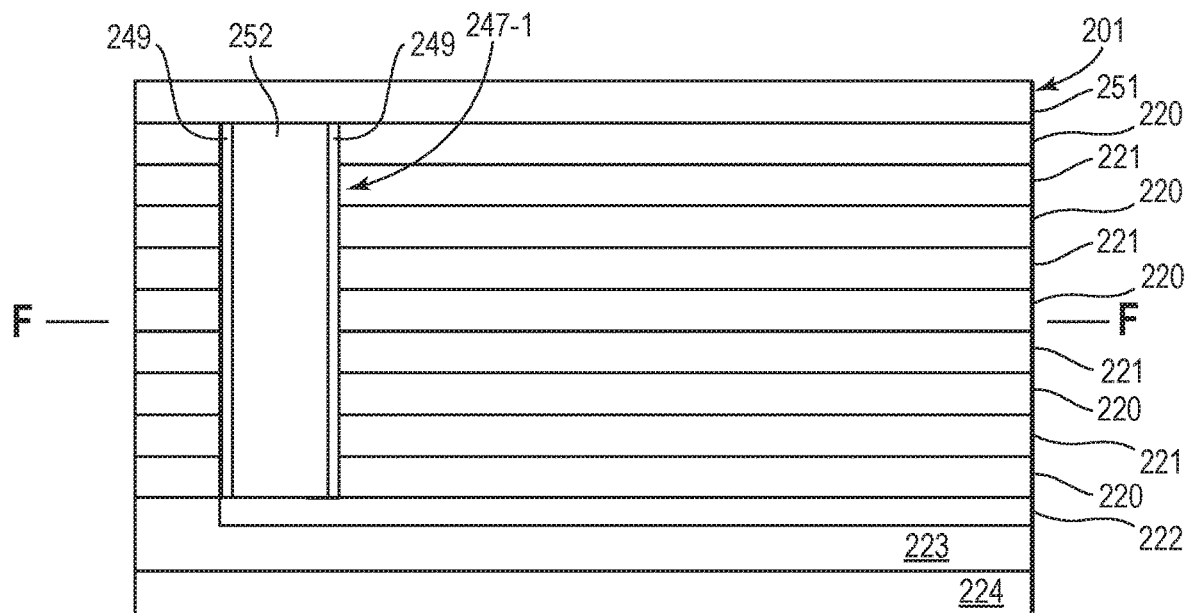
Figure 2G:
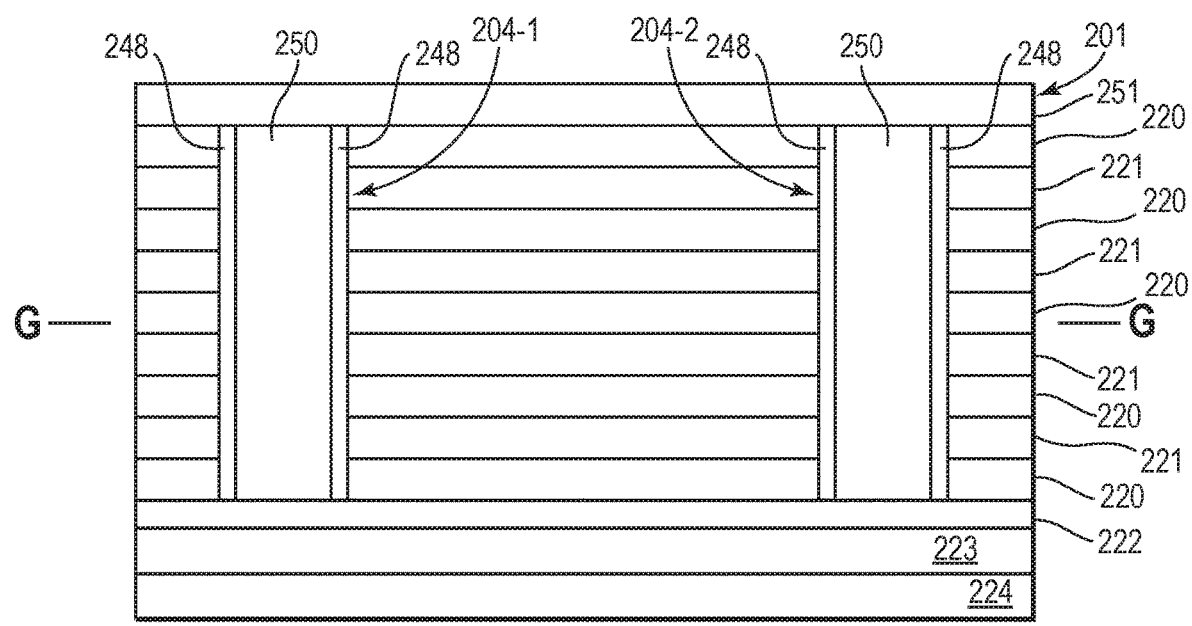

FIG. 2E is a top view corresponding to a stage of processing following the stage of processing corresponding to FIG. 2A in accordance with a number of embodiments of the present disclosure. FIG. 2F is a cross-section viewed along line F-F in FIG. 2E during the processing stage corresponding to FIG. 2E in accordance with a number of embodiments of the present disclosure. FIG. 2G is a cross-section viewed along line G-G in FIG. 2E during the processing stage corresponding to FIG. 2E in accordance with a number of embodiments of the present disclosure.

During the processing stage of FIGS. 2E to 2G, sets 206-1 to 206-3 of contacts 204-1 to 204-3 are formed through stack 201 respectively in the sets of openings 238-1 to 238-3 in region 213, as shown in FIGS. 2E and 2G. Separated termination structures 247-1 and 247-2 are formed through stack 201 in the openings 240-1 and 240-2 in region 214 concurrently with forming contacts 204-1 to 204-3.

In some examples, forming contacts 204 and termination structures 247 can include concurrently forming dielectric liners 248, such as oxide liners, in openings 238, as shown in FIGS. 2E and 2G, and dielectric liners 249, such as oxide liners, in openings 240, as shown in FIGS. 2E and 2F. A conductive structure, such as a metal structure 250 (e.g., of tungsten), is formed in each of the openings 238 lined with the dielectric liners 248 adjacent to dielectric liners 248, so that the dielectric liners 248 surround the metal structures 250. A conductive structure, such as a metal structure 252 (e.g., of tungsten), is formed in each of the openings 240 lined with the dielectric liners 249 adjacent to dielectric liners 249, so that the dielectric liners 249 surround the metal structures 252.

For example, metal structures 250 can be formed in the openings 238 lined with dielectric liners 248 concurrently with forming metal structures 252 in the openings 240 lined with dielectric liners 249. Each contact 204 can include a metal structure 250 surrounded by a dielectric liner 248, and each termination structure 247 can include a metal structure 252 surrounded by a dielectric liner 249. In some examples, a dielectric 251 that can be oxide can be formed over an upper surface of stack 201, over upper surfaces of contacts 204, and over upper surfaces of termination structures 247, and shown in FIGS. 2E to 2G.

Figure 2H:
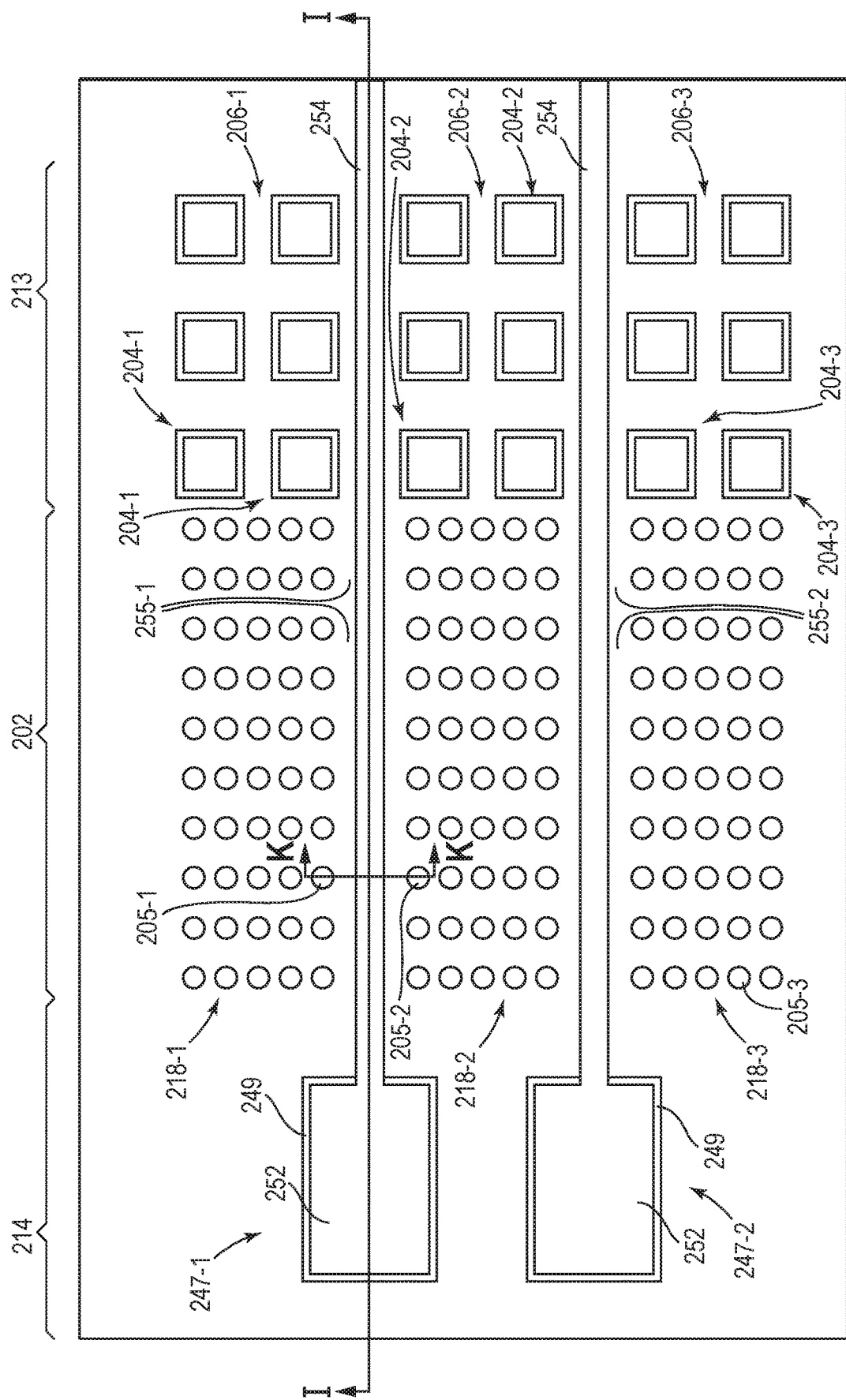
Figure 2I:
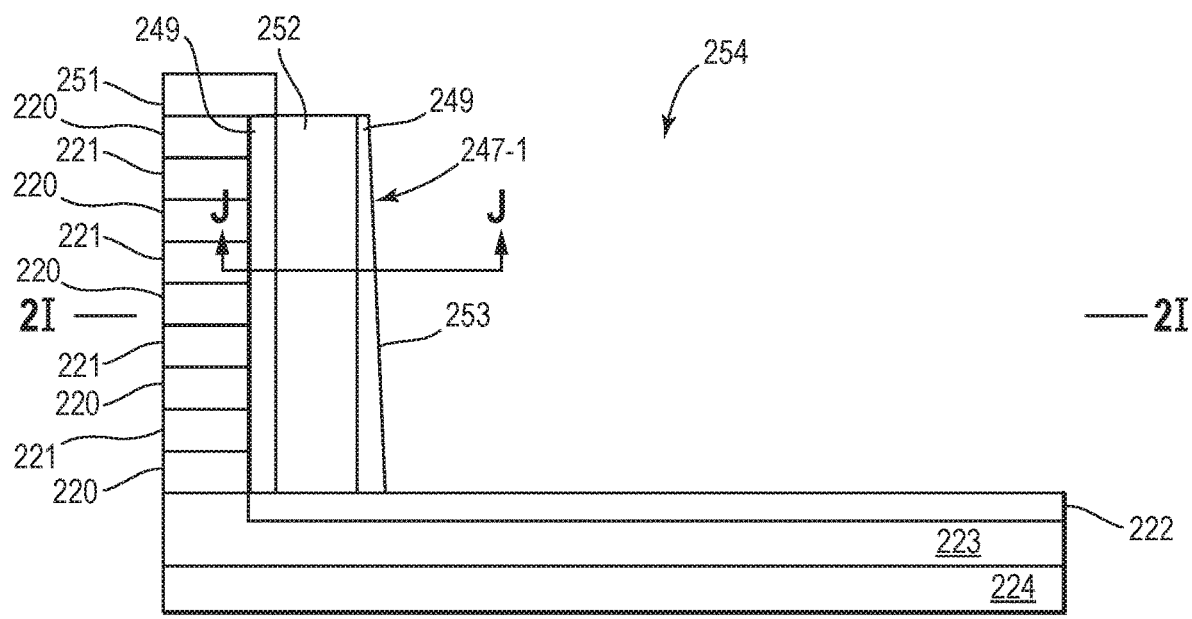
Figure 2J:
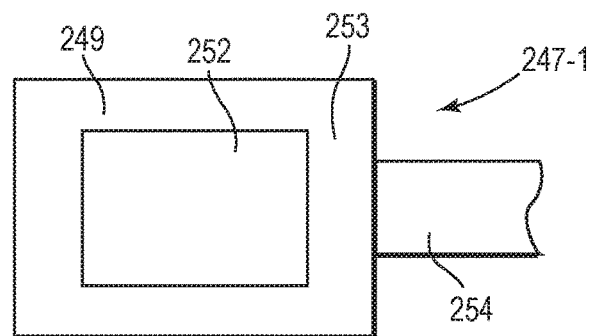
Figure 2K:
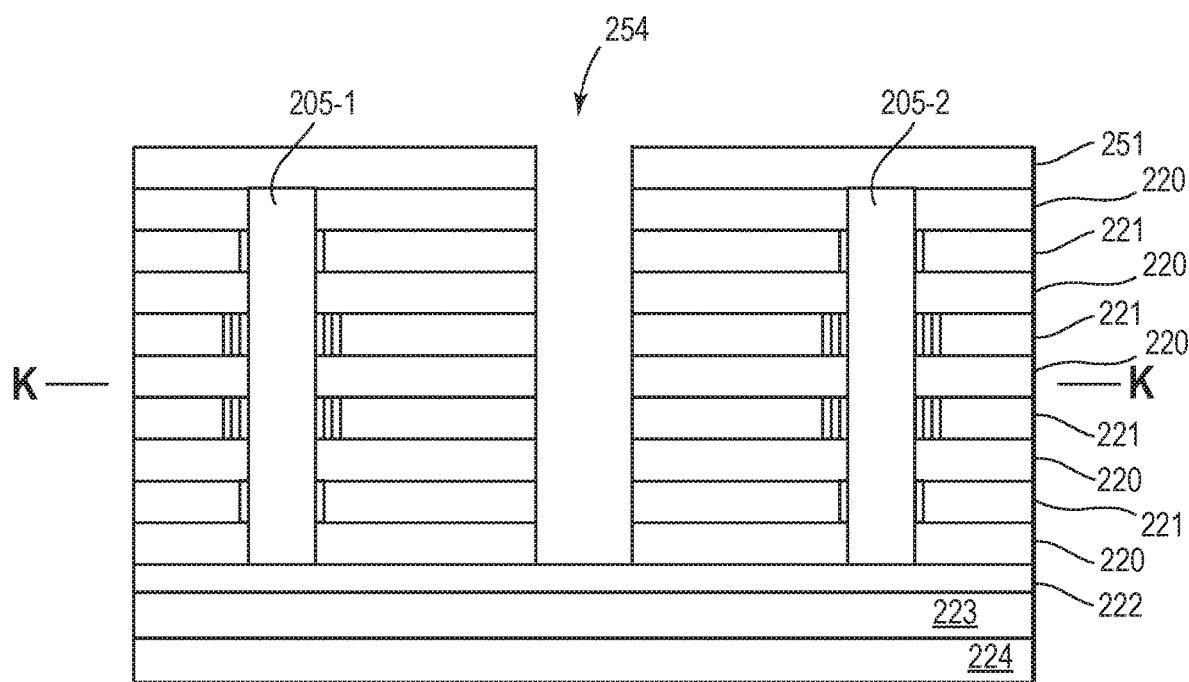

FIG. 2H is a top view corresponding to a stage of processing following the stage of processing corresponding to FIG. 2E in accordance with a number of embodiments of the present disclosure. FIG. 2I is a cross-section viewed along line I-I in FIG. 2H during the processing stage corresponding to FIG. 2H in accordance with a number of embodiments of the present disclosure. FIG. 2J is a cross-section viewed along line J-J in FIG. 2I during the processing stage corresponding to FIG. 2H in accordance with a number of embodiments of the present disclosure. FIG. 2K is a cross-section viewed along line K-K in FIG. 2H during the processing stage corresponding to FIG. 2H in accordance with a number of embodiments of the present disclosure.

During the processing stage corresponding to FIGS. 2H to 2K, an opening 254, such as a slot or slit, is formed through dielectric 251 and stack 201 in a region 255-1 between the sets 206-1 and 206-2 of contacts and between the groups 218-1 and 218-2 of semiconductors, and an opening 254 is formed in a region 255-2 between the sets 206-2 and 206-3 of contacts and between the groups 218-2 and 218-3 of semiconductors. Openings 254 can remove dielectric 251 from over the metal structure 252 of termination structures 247 to expose the upper surfaces of metal structure 252, as shown in FIG. 2I. Openings 254 pass through dielectric 251 and stack 201 in regions 255 and stop at an upper surface of metal plug 222, as shown in FIGS. 2I and 2K. Openings 254 can be performed as part of a replacement gate process in some examples.

Openings 254 can terminate at or in a sidewall 253 of dielectric liner 249 below dielectric 251, as shown in FIG. 2J. Forming an opening 254 can taper a portion of a corresponding dielectric liner 249 toward the top of the dielectric liner 249, as shown in FIG. 2I. Note that a dielectric liner 249 can completely surround a corresponding metal structure 252 below the uppermost surface of metal structure 252 and below dielectric 251, as shown in FIG. 2J. In some examples, the exposed portion of the upper surface of metal structure 252 can have a rectangular shape having short sides that are transverse to a corresponding opening 254 and long sides that can be parallel to the opening 254, as shown in FIG. 2H.

Note that openings 254 are analogous to the segments 110 of opening 108 in FIG. 1, and openings 240-1 and 240-2 are analogous to segment 112-1 of opening 108. Forming openings 240 concurrently with forming contact openings 238 before forming contacts 204 and forming termination structures 247 concurrently with forming contacts 204 before forming openings 254 can reduce the amount of movement of the semiconductor structures 205 relative to the movement of the semiconductor structures 105 associated with forming segments 110 of opening 108 and segment 112-1 concurrently in a single step after forming the contacts. Moreover, forming openings 254 after forming termination structures 247 can avoid the difficulties associated with forming the T-intersections between segments 110 and segment 112-1 that occur when forming opening 108 during a single etch.

Figure 2L:
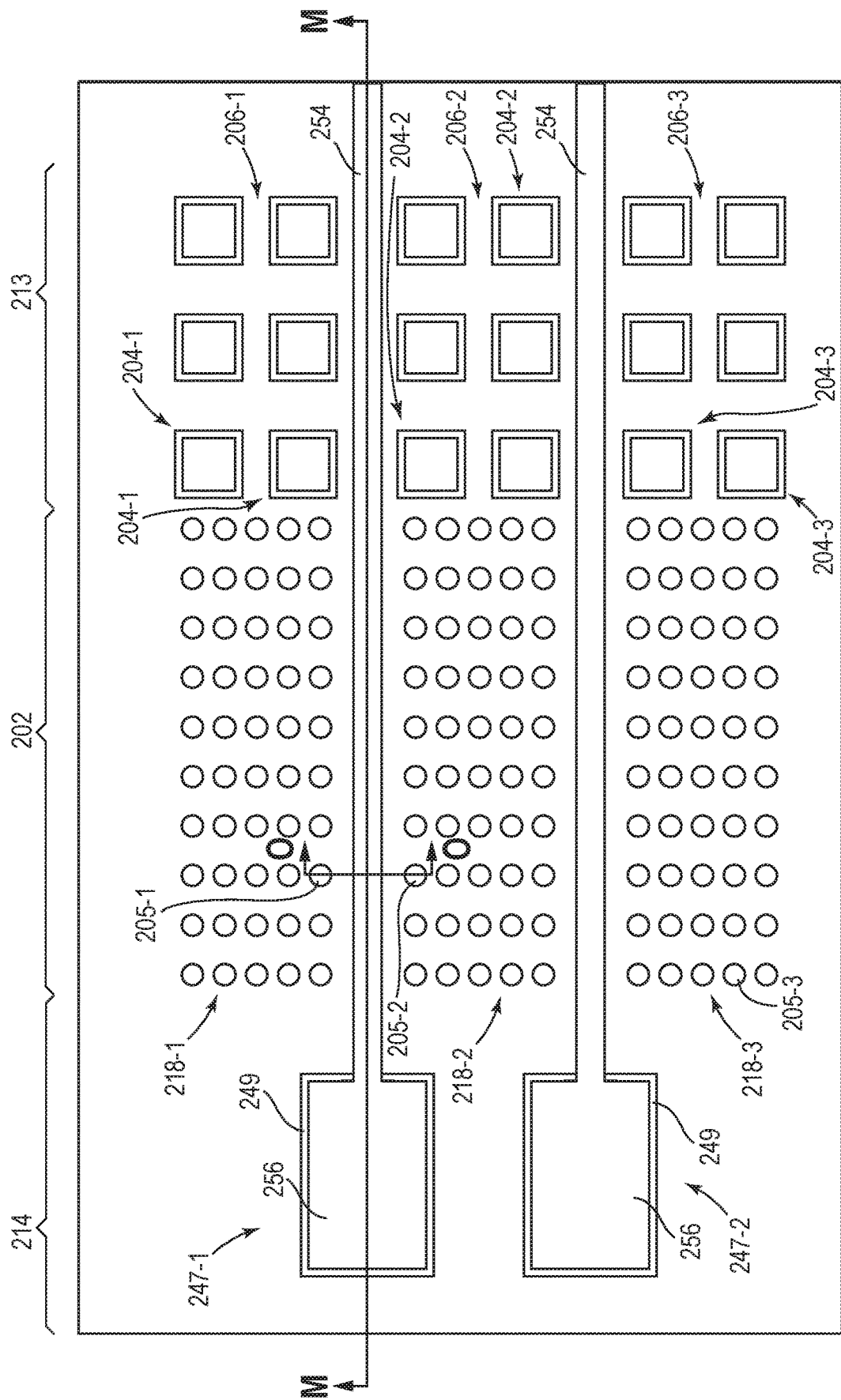
Figure 2M:
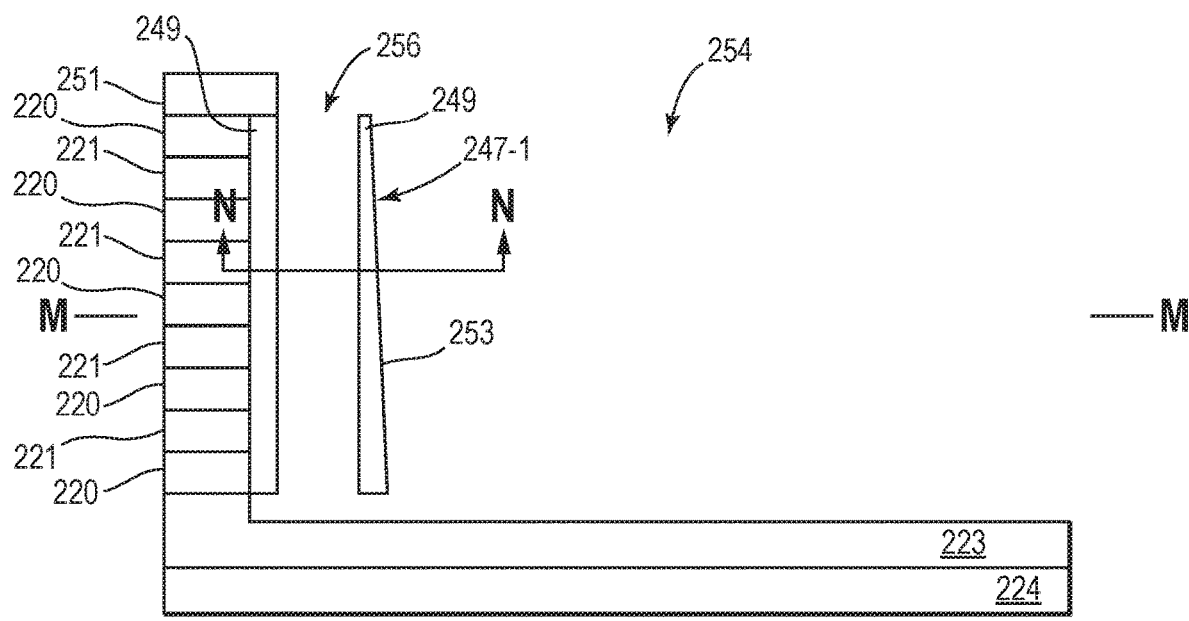
Figure 2N:
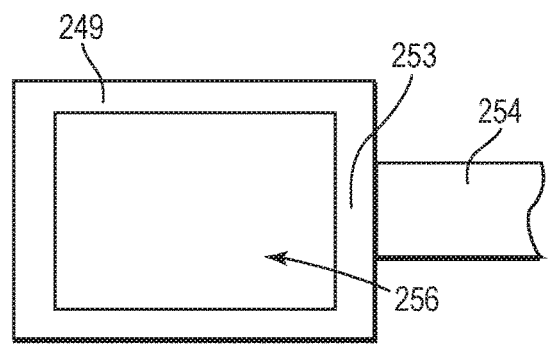

FIG. 2L is a top view corresponding to a stage of processing following the stage of processing corresponding to FIG. 2H in accordance with a number of embodiments of the present disclosure. FIG. 2M is a cross-section viewed along line M-M in FIG. 2L during a processing step of the processing stage corresponding to FIG. 2L in accordance with a number of embodiments of the present disclosure. FIG. 2N is a cross-section viewed along line N-N in FIG. 2M during the processing step corresponding to FIG. 2M in accordance with a number of embodiments of the present disclosure.

During the processing stage corresponding to FIGS. 2L to 2N, the exposed metal structures 252 in FIGS. 2H to 2K can be removed from termination structures to form openings 256, leaving dielectric liners 249 around openings 256. For example, the remaining dielectric liners 249 can be referred to as termination structures. An opening 254 can terminate at the sidewall 253 of a dielectric structure 249, as shown in FIG. 2N. Metal structures 252 can be accessed through openings 254. For example, a removal material, such as a wet etchant, selective to metal structures 252 can be supplied through openings 254 to remove metal structures 252. As shown in FIGS. 2M and 2N, dielectric liners 242 can line openings 256. For example, a dielectric liner 249 can wrap completely around a corresponding opening 256 below the upper ends of the dielectric liner 249 and below dielectric 251.

In some examples, metal plugs 222 can be removed during (e.g., concurrently with) the removal of metal structures 252. Metal plugs 222 can be accessed through openings 254. For example, the removal material that removes metal structures 252 can also remove metal plugs 222.

Figure 2O:
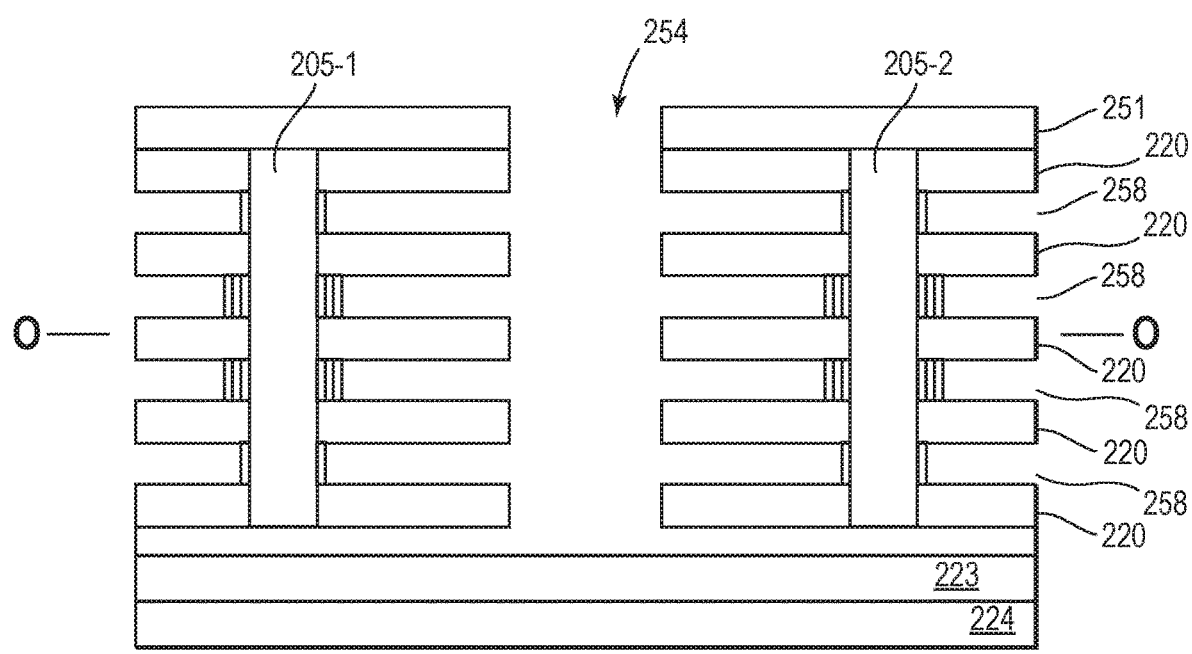

FIG. 2O is a cross-section viewed along line O-O in FIG. 2L during a subsequent processing step of the processing stage corresponding to FIG. 2L in accordance with a number of embodiments of the present disclosure. For example, after the removal of the metal structures 252, dielectrics 221 can be removed from regions 202 and 213.

Openings 254 can provide access to dielectrics 221 for the removal of dielectrics 221. For example, dielectrics 221 can be removed as part of a replacement gate process. A removal material, such as a wet etchant, can be supplied through openings 254 to remove dielectrics 221 to form a stack of dielectrics 220 alternating with spaces 258 in region 202, as shown in FIG. 2O, so that the groups 218-1 to 218-3 of semiconductor structures pass through dielectrics 220 alternating with spaces 258. For example, spaces 258 correspond to the removed dielectrics 221.

The uppermost and lowermost spaces 258 can expose the gate dielectrics 236, and the spaces 258 between the uppermost and lowermost spaces 258 can expose the blocking dielectrics 230. For example, semiconductor structures 205-1 and 205-2 pass through the stack of dielectrics 220 alternating with spaces 258 in region 202. The removal material supplied through openings 254 can also remove dielectrics 221 from region 213 so that contacts 204-1 to 204-2 pass through the stack of dielectrics 220 alternating with spaces 258 in region 213.

Dielectric liners 249 can be long enough in a direction parallel to openings 254 so that the removal material is prevented from flowing around the ends of dielectric liners 249. Dielectric liners 249 can prevent the removal material from the portions of region 202 corresponding to adjacent groups 218-1 and 218-2 from flowing into region 214 and removing dielectrics 221 there, which could provide a path for extraneous metal during a subsequent metal processing step. For example, the metal could cause an electrical short between access lines corresponding to group 118-1 and access lines corresponding to group 118-2 that can be formed from the metal and between access lines corresponding to group 118-2 and access lines corresponding to group 118-3.

The portion between dielectric liners 249 in region 214 can couple the alternating dielectrics 220 and 221 in region 214 to dielectrics 220 in region 202 and 213 while dielectrics 221 are removed. This coupling can restrict movement of the semiconductor structures 205 that could occur while dielectrics 221 are removed. For example, the coupling can reduce the movement of the semiconductor structures relative to the movement of the semiconductor structures associated with transverse segment 112-1 in FIG. 1.

Figure 2P:
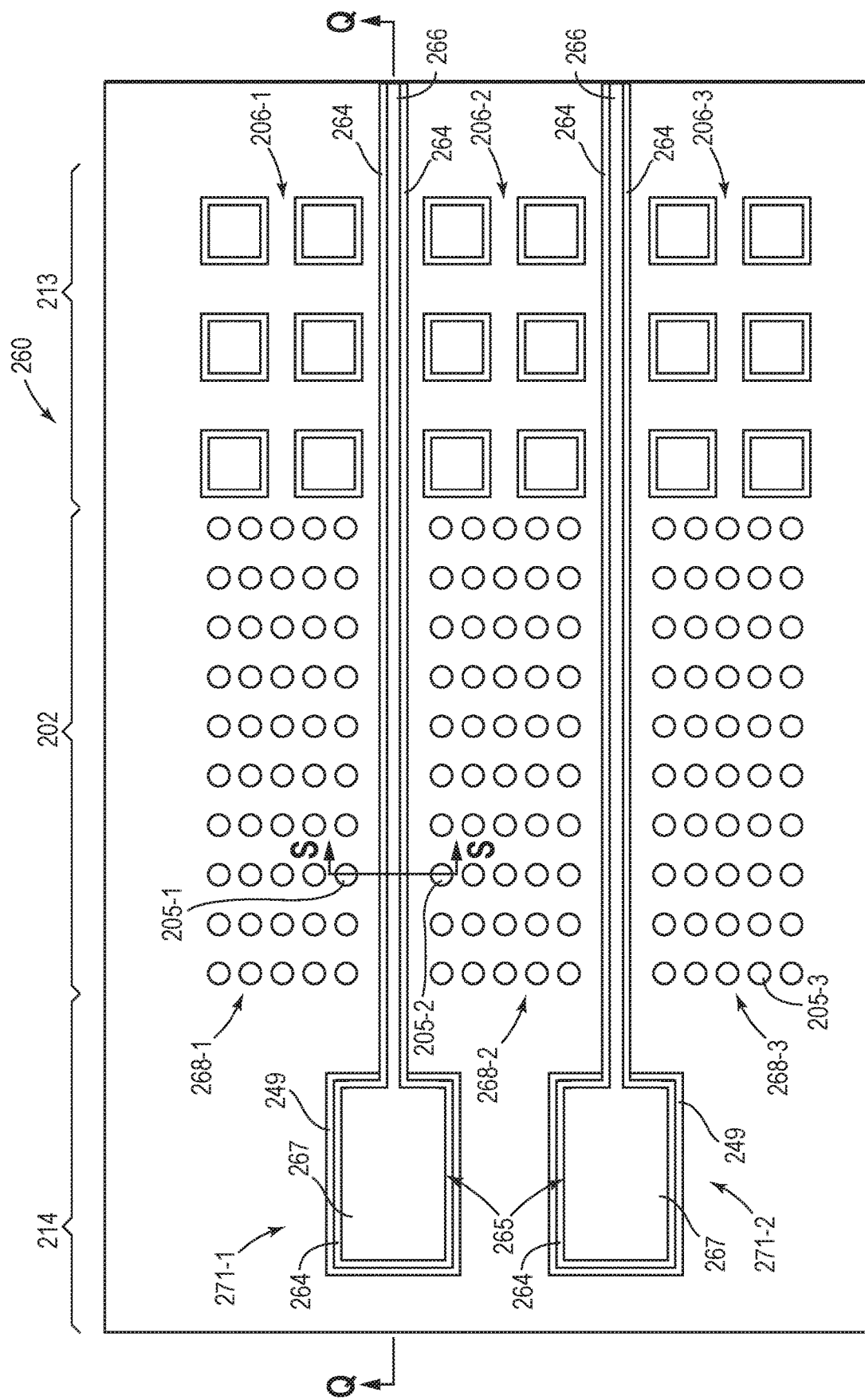
Figure 2Q:
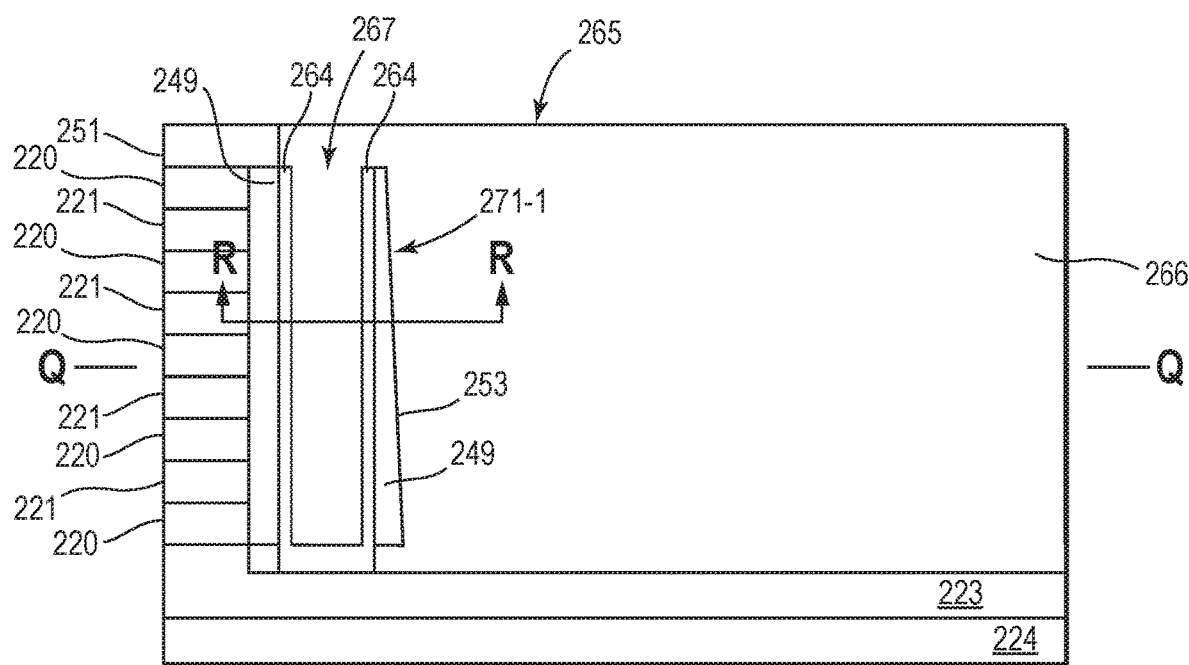
Figure 2R:
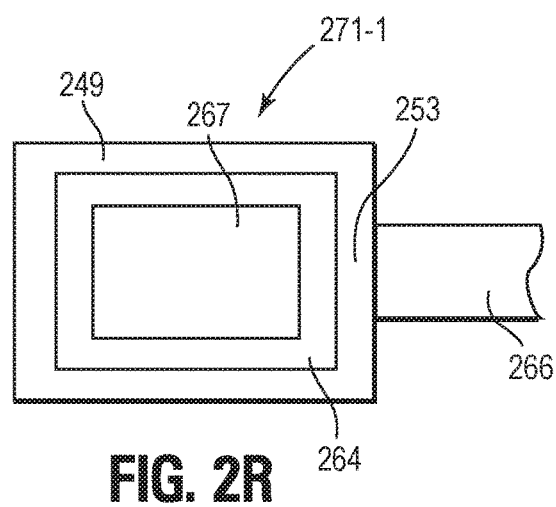
Figure 2S:
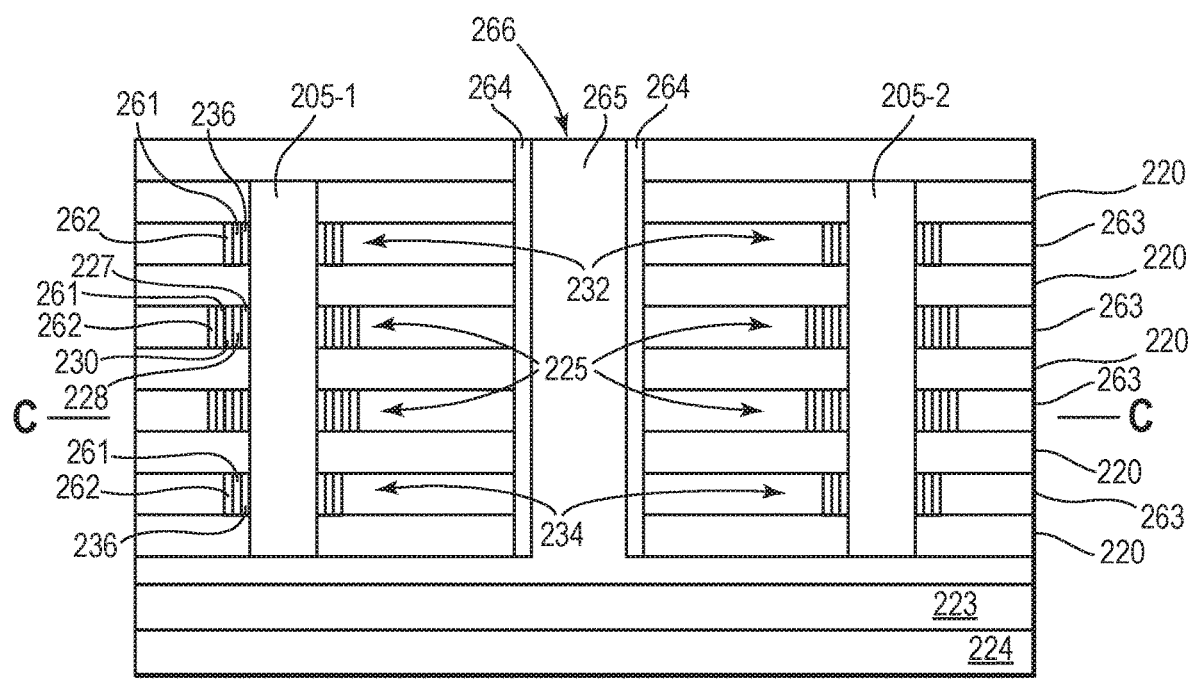

FIG. 2P is a top view corresponding to a stage of processing following the stage of processing corresponding to FIG. 2L in accordance with a number of embodiments of the present disclosure. FIG. 2Q is a cross-section viewed along line Q-Q in FIG. 2P during the processing stage corresponding to FIG. 2P in accordance with a number of embodiments of the present disclosure. FIG. 2R is a cross-section viewed along line R-R in FIG. 2Q during the processing stage corresponding to FIG. 2P in accordance with a number of embodiments of the present disclosure. FIG. 2S is a cross-section viewed along line S-S in FIG. 2P during the processing stage corresponding to FIG. 2P in accordance with a number of embodiments of the present disclosure.

The processing stage depicted in FIGS. 2P-2S can form a memory array 260, for example. In some examples, the openings 254 provide access to the spaces 258 to complete the formation of memory cells 225 and select transistors 232 and 234. For example, formation of memory cells 225 and select transistors 232 and 234 can be completed as part of a replacement gate process.

In some examples, a dielectric 261 can be supplied through openings 254 to form dielectric 261 in the spaces 258 adjacent to gate dielectrics 236 and blocking dielectrics 230, as shown in FIG. 2S. For example, dielectric 261 can be high-dielectric-constant (high-K) dielectric, such as alumina ($Al_2O_3$), hafnia ($HfO_2$), zirconia ($ZrO_2$), praseodymium oxide ($Pr_{2O3}$), hafnium tantalum oxynitride (HfTaON), hafnium silicon oxynitride (HfSiON), or the like. An interface metallic 262 (e.g., a barrier metal), such as tantalum nitride (TaN), titanium nitride (TiN), or the like, can be supplied through openings 254 to form interface metallic 262 in the spaces 258 adjacent to dielectric 261, as shown in FIG. 2S.

A conductor, such as metal 263 (e.g., tungsten), can be supplied through openings 254 to form metal 263 in the spaces 258 adjacent to interface metallic 262, as shown in FIG. 2S. For example, metal 263 can form lines, such as access lines that can include control gates of memory cells 225 and control lines that can include gates of select transistors 232 and 234. For example, levels of metal 263 can be formed in the spaces 258 as part of a replacement gate process. In some examples, dielectric 261, interface metallic 262, and metal 263 can wrap completely around the corresponding semiconductor structures 205.

The portion between dielectric liners 249 (shown in FIG. 2P) can couple the alternating dielectrics 220 and 221 in region 214 to dielectrics 220 in region 202 and 213 while the levels of metal 263 are formed. This coupling can restrict movement of the semiconductor structures 205 that could occur while the levels of metal 263 are formed. For example, the coupling can reduce the movement of the semiconductor structures relative to the movement of the semiconductor structures associated with transverse segment 112-1 in FIG. 1.

After the formation of metal 263 in spaces 258 and the completion of select transistors 232 and 243 and memory cells 225, openings 254 and the openings 256 lined with dielectric liner 249 can be lined with a dielectric liner 264, such as an oxide liner. For example, dielectric liner 264 can be formed adjacent to dielectric liner 249 in openings 256, as shown in FIGS. 2P to 2R, and adjacent to the dielectrics 220 alternating with the levels of metal 263, as shown in FIG. 2S. For example, a dielectric liner 249 can wrap completely around a corresponding dielectric liner 264 below the upper ends of the dielectric liner 249 and below dielectric 251.

Subsequently, a semiconductor 265 (e.g., of polysilicon), is formed in the openings 254 lined with liners 264 to form semiconductor structures 266 in the openings 254 lined with liners 264 by forming semiconductor 265 adjacent to those liners 264, as shown in FIGS. 2P and 2S. Semiconductor 265 can also be formed in the openings 256 lined with liners 264 to form semiconductor structures 267 in the openings 256 lined with liners 264 by forming semiconductor 265 adjacent to those liners 264, as shown in FIGS. 2P to 2R. Note that a dielectric liner 264 can wrap completely around a semiconductor structure 267 below the upper ends of the dielectric liner 264 and below dielectric 251, as shown in FIG. 2R. The structures including a dielectric liner 264 wrapped around semiconductor structure 267 and dielectric liner 249 wrapped around dielectric liner 264 can be a termination structures 271-1 and 271-2, for example. Semiconductor structures 266 can terminate at the termination structure 271, as termination structure 271-1 in FIG. 2Q. For example, a semiconductor structures 266 can terminate at the sidewall 253 of the dielectric liner 249 of a termination structure 271, as termination structure 271-1 in FIG. 2Q.

In some examples, memory cells 225 can form groups of series-coupled memory cells (e.g., a NAND strings) adjacent to semiconductor structures 205 and coupled in series with select transistors 232 and 234. The memory cells adjacent to semiconductor structures 205-1 can form a block 268-1 of memory cells; the memory cells adjacent to semiconductor structures 205-2 can form a block 268-2 of memory cells; and the memory cells adjacent to semiconductor structures 205-3 can form a block 268-3 of memory cells. Note that structures with a semiconductor structure 266 adjacent to a dielectric liner 264 can pass through a stack of dielectrics 220 alternating with layers of metal 263 between blocks 268-1 and 268-1 and between blocks 268-2 and 268-3, as shown in FIGS. 2P and 2S.

FIG. 3A is a top view corresponding to a particular stage of processing associated with forming a stacked memory array in accordance with a number of embodiments of the present disclosure. An opening having a perimeter 341 can be formed through a stack 301 of alternating dielectrics in a manner similar to forming openings 240, as previously described in conjunction with FIGS. 2A and 2B. For example, stack 301 can be stack 201. The opening can replace an opening 240 and can be formed in the region 214 of stack 201 concurrently with forming contact openings 238.

The opening can be lined with a dielectric liner 349, such as an oxide liner, that can have a tab 370 that can extend into stack 301 away from the lined opening. For example, tab 370 can extend from a sidewall 353 of dielectric liner 349 that can be analogous to sidewall 253 of dielectric liner 249. Tab 370 can have a rectangular profile (e.g., shape) when viewed from the top, for example. Tab 370 can extend toward a memory-cell region, such as memory cell region 202 in FIG. 2A. Dielectric liner 349 can be formed concurrently with the dielectric liners 248 in FIGS. 2E and 2G, for example.

A conductive structure, such as a metal structure 352 (e.g., of tungsten), can be formed in the lined opening adjacent to liner 349 to form a termination structure 347 that includes dielectric liner 349 surrounding metal structure 352. For example, each of the termination structures 247-1 and 247-2 in FIGS. 2E and 2F can be replaced by a respective termination structure 347. Metal structure 352 can be formed concurrently with the metal structures 250 in FIGS. 2E and 2G, for example. As such, termination structure 347 can be formed concurrently with contacts, such as contacts 204 in FIGS. 2E and 2G.

FIG. 3B is a top-down view of a processing stage following the processing stage corresponding to FIG. 3A in accordance with a number of embodiments of the present disclosure. A dielectric 351, such as oxide, can be formed over stack 301 and an upper surface of termination structure 347. For example, dielectric 351 can be formed over an upper surface 372 of metal structure 352. An opening 354, such as a slot or slit, can be formed through dielectric 351 and stack 301. For example, opening 354 can be an opening 254 in FIGS. 2H to 2K and can be formed between groups of semiconductor structures, such as between the groups 218-1 and 218-2 of semiconductor structures, so that the opening exposes at least a portion of the upper surface 372 of metal structure 352. For example, a portion of opening 354 can extend over a portion of metal structure 352 and terminate there. A remaining portion of opening 354 can terminate at dielectric liner 349 below upper surface 372 and below dielectric 351 in a manner similar to opening 254 terminating at dielectric liner 249 in FIGS. 2I and 2J.

Tab 370 can increase the thickness of dielectric liner 349 relative to dielectric liner 249 and can compensate for the tapering of dielectric liner due the formation of opening 354, as previously described in conjunction with FIG. 2I. For example, tab 370 can increase the thickness of sidewall 353 relative to the thickness of sidewall 253 of dielectric liner 249. For example, the increased thickness can reduce the likelihood of opening 354 passing through sidewall 353 adjacent to the top of metal structure 352 due to the tapering effect.

FIG. 3C is a cross-section corresponding to a processing stage following the processing stage of FIG. 3B in accordance with a number of embodiments of the present disclosure. FIG. 3C can correspond to the cross-section of FIG. 2N viewed along line N-N in FIG. 2M. For example, the cross-section in FIG. 3C can be below the dielectric 351 and below the upper ends dielectric liner 349.

During the processing stage corresponding to FIG. 3C, metal structure 352 is removed to form an opening 356, leaving dielectric liner 349. For example, the formation of opening 356 can be analogous the formation of opening 256, as discussed previously in conjunction with FIGS. 2L to 2N. For example, metal structure 352 can be accessed at its exposed upper surface 372 through opening 354. Dielectric liner 349 can form a termination structure that terminates opening 354. In some examples, each of the openings 254 in FIG. 2L can terminate at a respective dielectric liner 349. Note that at least a portion of opening 354 terminates at tab 370, and portions of opening 354 on either side if tab 370 can terminate at sidewall 353. For example, tab 370 extends into opening 354.

Subsequently, dielectrics in stack 301, (e.g., corresponding dielectrics 221 in stack 201) can be removed by accessing those dielectrics through opening 354, such as during a replacement gate process, to form spaces in place of the removed dielectrics. For example, the removal of the dielectrics can form a structure similar to the structure in FIG. 2O. The termination of opening 354 at tab 370 and at sidewall 353, as shown in FIG. 3C, can prevent removal material in opening 354 from flowing around dielectric liner 349 and forming a path for extraneous metal could cause an electrical short between access lines formed from the metal on either side of opening 354, such as between access lines corresponding to group 218-1 and access lines corresponding to group 218-2 in FIG. 2L.

FIG. 3D is a cross-section corresponding to a processing stage following the processing stage of FIG. 3C in accordance with a number of embodiments of the present disclosure. FIG. 3D can correspond to the cross-section of FIG. 2R viewed along line R-R in FIG. 2Q. For example, the cross-section in FIG. 3D can be below the dielectric 351 and below the upper ends dielectric liner 349.

During the processing stage corresponding to FIG. 3D, opening 354 and the opening 356 lined with dielectric liner 349 can be lined with a dielectric liner 364, such as an oxide liner. For example, dielectric liner 364 can be formed adjacent to dielectric liner 349 in opening 356. For example, dielectric liner 349 can wrap completely around dielectric liner 364 below the upper ends of the dielectric liner 349 and below dielectric 351.

Subsequently, a semiconductor structure 366 (e.g., of polysilicon), is formed in the opening 354 lined with liner 364 by forming semiconductor structure 366 adjacent to those liners 364. A semiconductor structure 367 (e.g., of polysilicon) is formed in the opening 356 lined with liner 364 by forming semiconductor structure 367 adjacent to that liner 364. In some examples, a structure with a semiconductor structure 366 adjacent to a dielectric liner 364 can pass through a stack of dielectrics alternating with layers of metal, such as a stack of dielectrics 220 alternating with layers of metal 263 (FIG. 2S), between blocks of memory cells, such as between blocks 268-1 and 268-1 and between blocks 268-2 and 268-3 (FIG. 2P).

Dielectric liner 364 can wrap completely around semiconductor structure 367 below the upper ends of the dielectric liner 364 and below dielectric 351. Tab 370 can extend into the semiconductor structure 367. The structure including a dielectric liner 364 wrapped around semiconductor structure 367 and dielectric liner 349 wrapped around dielectric liner 364 can be a termination structure 371. For example, semiconductor structure 366 can terminate at termination structure 371 with a portion of semiconductor structure 366 terminating at tab 370. For example, portions of semiconductor structure 366 can terminate at sidewall 353 and a remaining portion of semiconductor structure 366 therebetween can terminate at tab 370. The dielectric liner 364 on either side of semiconductor structure 366 can terminate at sidewall 353.

Figure 4A:
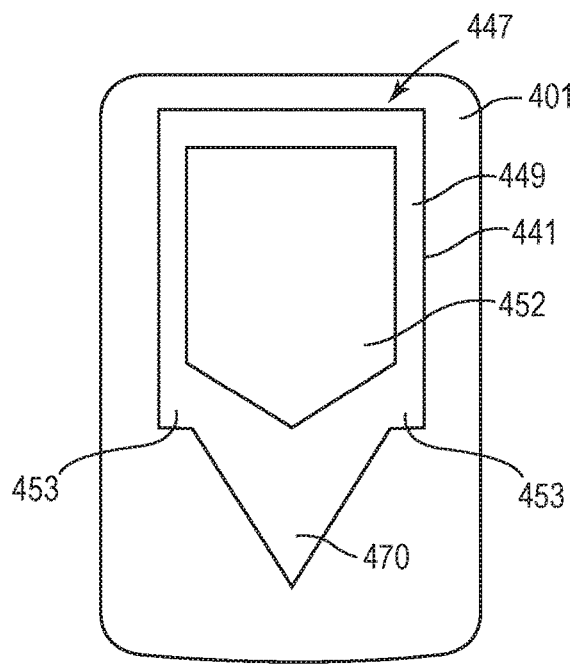
FIGS. 4A to 4D are various views corresponding to particular stages of processing associated with forming a stacked memory array in accordance with a number of embodiments of the present disclosure.

FIG. 4A is a top view corresponding to a particular stage of processing associated with forming a stacked memory array in accordance with a number of embodiments of the present disclosure. An opening having a perimeter 441 can be formed through a stack 401 of alternating dielectrics in a manner similar to forming openings 240, as previously described in conjunction with FIGS. 2A and 2B. For example, stack 401 can be stack 201. The opening can replace an opening 240 and can be formed in the region 214 of stack 201 concurrently with forming contact openings 238.

The opening can be lined with a dielectric liner 449, such as an oxide liner, that can have a tab 470 that can extend into stack 401 away from the lined opening. For example, tab 470 can extend from a sidewall 453 of dielectric liner 449 that can be analogous to sidewall 253 of dielectric liner 249. For example, tab 470 can have a triangular profile when viewed from the top. Tab 470 can extend toward a memory-cell region, such as memory cell region 202 in FIG. 2A. Dielectric liner 449 can be formed concurrently with the dielectric liners 248 in FIGS. 2E and 2G, for example.

A conductive structure, such as a metal structure 452 (e.g., of tungsten), can be formed in the lined opening adjacent to liner 449 to form a termination structure 447 that includes dielectric liner 449 surrounding metal structure 452. For example, each of the termination structures 247-1 and 247-2 in FIGS. 2E and 2F can be replaced by a respective termination structure 447. Metal structure 452 can be formed concurrently with the metal structures 250 in FIGS. 2E and 2G, for example. As such, termination structure 447 can be formed concurrently with contacts, such as contacts 204 in FIGS. 2E and 2G.

Figure 4B:
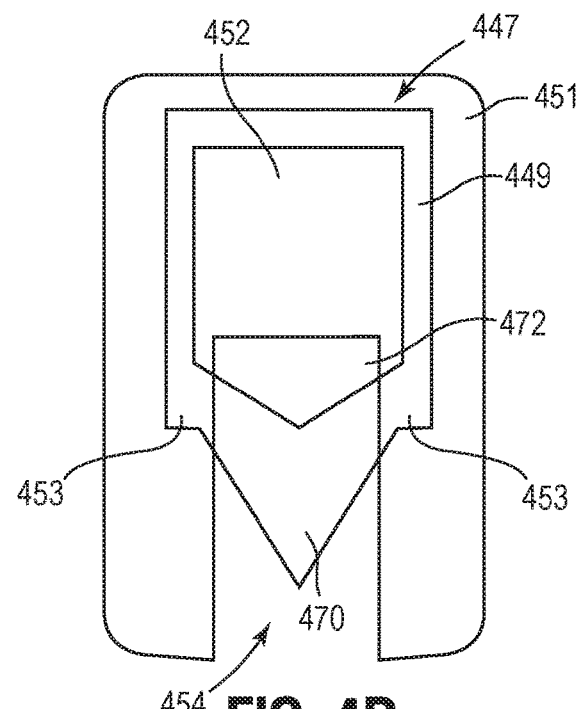

FIG. 4B is a top-down view of a processing stage following the processing stage corresponding to FIG. 4A in accordance with a number of embodiments of the present disclosure. A dielectric 451, such as oxide, can be formed over stack 401 and an upper surface of termination structure 447. For example, dielectric 451 can be formed over an upper surface 472 of metal structure 452. An opening 454, such as a slot or slit, can be formed through dielectric 451 and stack 401. For example, opening 454 can be an opening 254 in FIGS. 2H to 2K and can be formed between groups of semiconductor structures, such as between the groups 218-1 and 218-2 of semiconductor structures, so that the opening exposes at least a portion of the upper surface 472 of metal structure 452. For example, a portion of opening 454 can extend over a portion of metal structure 452 and terminate there. A remaining portion of opening 454 can terminate at dielectric liner 449 below upper surface 472 and below dielectric 451 in a manner similar to opening 254 terminating at dielectric liner 249 in FIGS. 2I and 2J.

Tab 470 can increase the thickness of dielectric liner 449 relative to dielectric liner 249 and can compensate for the tapering of dielectric liner due the formation of opening 454, as previously described in conjunction with FIG. 2I. For example, tab 470 can increase the thickness of sidewall 453 relative to the thickness of sidewall 253 of dielectric liner 249. The increased thickness can reduce the likelihood of opening 454 passing through sidewall 453 adjacent to the top of metal structure 452 due to the tapering effect.

Figure 4C:
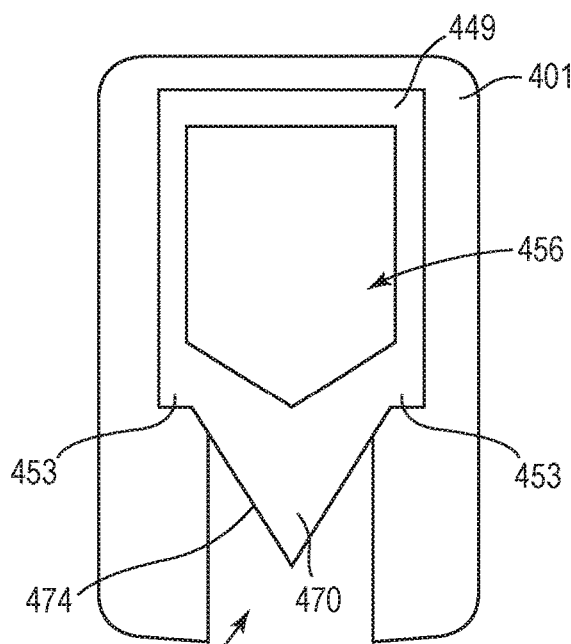

FIG. 4C is a cross-section corresponding to a processing stage following the processing stage of FIG. 4B in accordance with a number of embodiments of the present disclosure. FIG. 4C can correspond to the cross-section of FIG. 2N viewed along line N-N in FIG. 2M. For example, the cross-section in FIG. 4C can be below the dielectric 451 and below the upper ends dielectric liner 449.

During the processing stage corresponding to FIG. 4C, metal structure 452 is removed to form an opening 456, leaving dielectric liner 449. For example, the formation of opening 456 can be analogous the formation of opening 256, as discussed previously in conjunction with FIGS. 2L to 2N. For example, metal structure 452 can be accessed at its exposed upper surface 472 through opening 454. Dielectric liner 449 can form a termination structure that terminates opening 454. In some examples, each of the openings 254 in FIG. 2L can terminate at a respective dielectric liner 449. Note that opening 454 terminates at tab 470, such as at a V-shaped surface 474 of tab 470. For example, tab 470 extends into opening 454. In some examples, each of the openings 254 in FIG. 2L can terminate at a respective tab 470 of respective dielectric liner 449.

Subsequently, dielectrics in stack 401, (e.g., corresponding dielectrics 221 in stack 201) can be removed by accessing those dielectrics through opening 454, such as during a replacement gate process, to form spaces in place of the removed dielectrics. For example, the removal of the dielectrics can form a structure similar to the structure in FIG. 2O. The termination of opening 454 at V-shaped surface 474, as shown in FIG. 4C, can prevent removal material in opening 454 from flowing around dielectric liner 449 and forming a path for extraneous metal could cause an electrical short between access lines formed from the metal on either side of opening 454, such as between access lines corresponding to group 218-1 and access lines corresponding to group 218-2 in FIG. 2L.

Figure 4D:
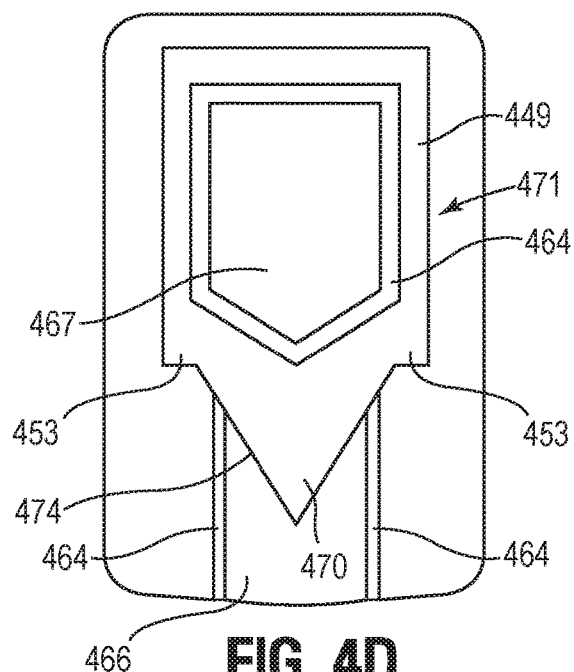

FIG. 4D is a cross-section corresponding to a processing stage following the processing stage of FIG. 4C in accordance with a number of embodiments of the present disclosure. FIG. 4D can correspond to the cross-section of FIG. 2R viewed along line R-R in FIG. 2Q. For example, the cross-section in FIG. 4D can be below the dielectric 451 and below the upper ends dielectric liner 449.

During the processing stage corresponding to FIG. 4D, opening 454 and the opening 456 lined with dielectric liner 449 can be lined with a dielectric liner 464, such as an oxide liner. For example, dielectric liner 464 can be formed adjacent to dielectric liner 449 in opening 456. For example, dielectric liner 449 can wrap completely around dielectric liner 464 below the upper ends of the dielectric liner 449 and below dielectric 451.

Subsequently, a semiconductor structure 466 (e.g., of polysilicon), is formed in the opening 454 lined with liner 464 by forming semiconductor structure 466 adjacent to that liner 464. A semiconductor structure 467 (e.g., of polysilicon) is formed in the opening 456 lined with liner 464 by forming semiconductor structure 467 adjacent to that liner 464. Dielectric liner 464 can wrap completely around semiconductor structure 467 below the upper ends of the dielectric liner 464 and below dielectric 451. Tab 470 can extend into the semiconductor structure 467.

The structure including a dielectric liner 464 wrapped around semiconductor structure 467 and dielectric liner 449 wrapped around dielectric liner 464 can be a termination structure 471. For example, semiconductor structure 466 and the dielectric liner 464 on either side of semiconductor structure 466 can terminate at tab 470. For example, semiconductor structure 466 and the dielectric liner 464 on either side of semiconductor structure 466 can terminate at V-shaped surface 474. In some examples, a structure with a semiconductor structure 466 adjacent to a dielectric liner 464 can pass through a stack of dielectrics alternating with layers of metal, such as the stack of dielectrics 220 alternating with layers of metal 263 (FIG. 2S), between blocks of memory cells, such as between blocks 268-1 and 268-1 and between blocks 268-2 and 268-3 (FIG. 2P).

Figure 5A:
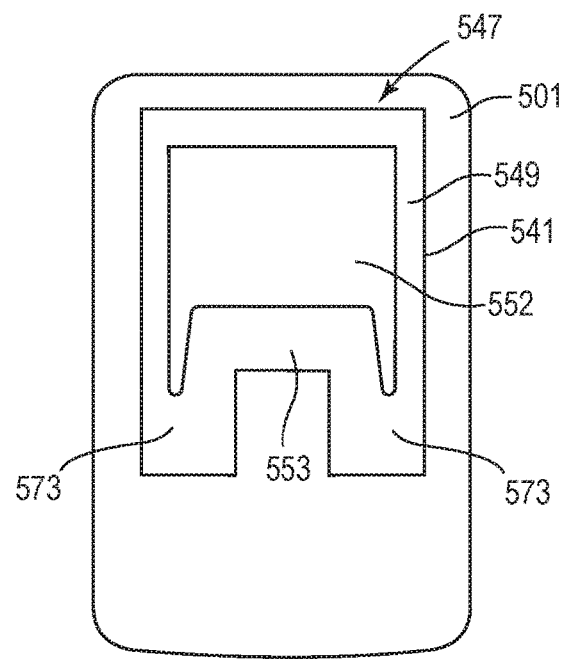
FIGS. 5A to 5D are various views corresponding to particular stages of processing associated with forming a stacked memory array in accordance with a number of embodiments of the present disclosure.

FIG. 5A is a top view corresponding to a particular stage of processing associated with forming a stacked memory array in accordance with a number of embodiments of the present disclosure. An opening having a perimeter 541 can be formed through a stack 501 of alternating dielectrics in a manner similar to forming openings 240, as previously described in conjunction with FIGS. 2A and 2B. For example, stack 501 can be stack 201. The opening can replace an opening 240 and can be formed in the region 214 of stack 201 concurrently with forming contact openings 238.

The opening can be lined with a dielectric liner 549, such as an oxide liner, that can have a pair of separated prongs 573 that can extend (e.g., protrude) into stack 501 away from the lined opening. For example, prongs 573 can extend from a sidewall 553 of dielectric liner 549 that can be analogous to sidewall 253 of dielectric liner 249. For example, prongs 573 can have rectangular profiles when viewed from the top. Prongs 573 can extend toward a memory-cell region, such as memory cell region 202 in FIG. 2A. Dielectric liner 549 can be formed concurrently with the dielectric liners 248 in FIGS. 2E and 2G, for example.

A conductive structure, such as a metal structure 552 (e.g., of tungsten), can be formed in the lined opening adjacent to liner 549 to form a termination structure 547 that includes dielectric liner 549 surrounding metal structure 552. For example, each of the termination structures 247-1 and 247-2 in FIGS. 2E and 2F can be replaced by a respective termination structure 547. Metal structure 552 can be formed concurrently with the metal structures 250 in FIGS. 2E and 2G, for example. As such, termination structure 547 can be formed concurrently with contacts, such as contacts 204 in FIGS. 2E and 2G.

Figure 5B:
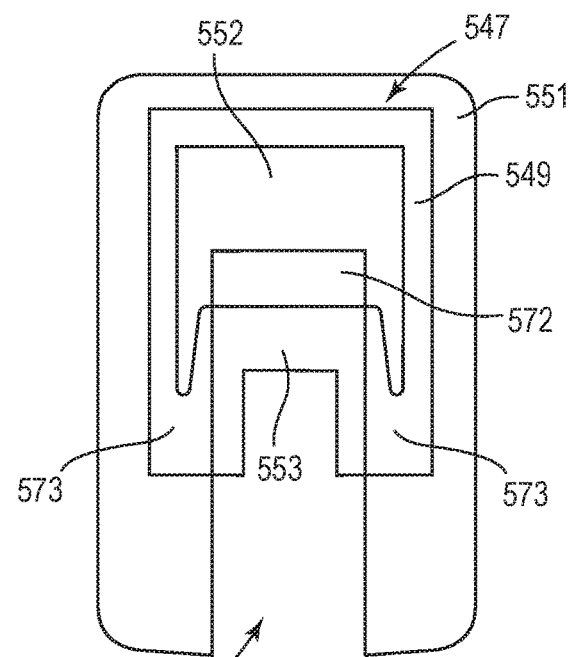

FIG. 5B is a top-down view of a processing stage following the processing stage corresponding to FIG. 5A in accordance with a number of embodiments of the present disclosure. A dielectric 551, such as oxide, can be formed over stack 501 and an upper surface of termination structure 547. For example, dielectric 551 can be formed over an upper surface 572 of metal structure 552. An opening 554, such as a slot or slit, can be formed through dielectric 551 and stack 501. For example, opening 554 can be an opening 254 in FIGS. 2H to 2K and can be formed between groups of semiconductor structures, such as between the groups 218-1 and 218-2 of semiconductor structures, so that the opening exposes at least a portion of the upper surface 572 of metal structure 552. For example, a portion of opening 554 can extend over a portion of metal structure 552 and terminate there. A remaining portion of opening 554 can terminate at dielectric liner 549 below upper surface 572 and below dielectric 551 in a manner similar to opening 254 terminating at dielectric liner 249 in FIGS. 2I and 2J.

Prongs 573 can increase the thickness of dielectric liner 549 relative to dielectric liner 249 and can compensate for the tapering of dielectric liner due the formation of opening 554, as previously described in conjunction with FIG. 2I. For example, prongs 573 can increase the thickness of sidewall 453 relative to the thickness of sidewall 253 of dielectric liner 249. The increased thickness can reduce the likelihood of opening 554 passing through sidewall 553 adjacent to the top of metal structure 552 due to the tapering effect.

Figure 5C:
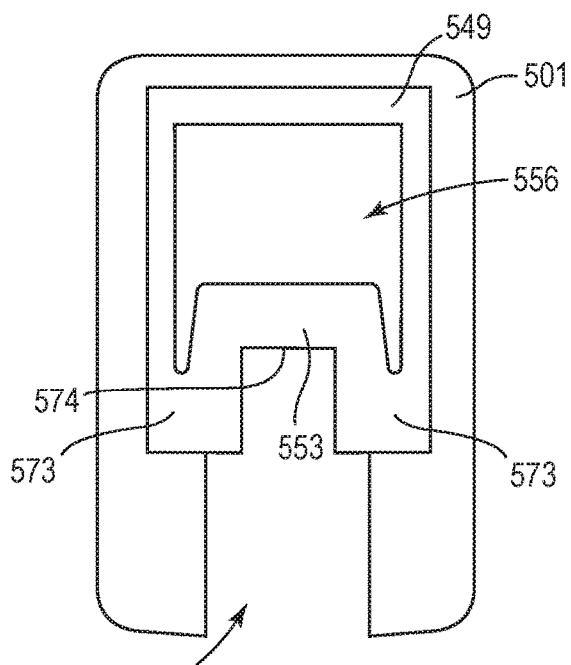

FIG. 5C is a cross-section corresponding to a processing stage following the processing stage of FIG. 5B in accordance with a number of embodiments of the present disclosure. FIG. 5C can correspond to the cross-section of FIG. 2N viewed along line N-N in FIG. 2M. For example, the cross-section in FIG. 5C can be below the dielectric 551 and below the upper ends dielectric liner 549.

During the processing stage corresponding to FIG. 5C, metal structure 552 is removed to form an opening 556, leaving dielectric liner 549. For example, the formation of opening 556 can be analogous the formation of opening 256, as discussed previously in conjunction with FIGS. 2L to 2N. For example, metal structure 552 can be accessed at its exposed upper surface 572 through opening 554. Dielectric liner 549 can form a termination structure that terminates opening 554. In some examples, each of the openings 254 in FIG. 2L can terminate at a respective dielectric liner 549. Note that portions of opening 554 can terminate at prongs 573 while another portion can extend into a recess between prongs 573 and terminate at a recessed surface 574 of dielectric liner 549, such as the surface of sidewall 553, between prongs 573. For example, recessed surface 574 can be recessed from the ends of prongs 572.

Subsequently, dielectrics in stack 501, (e.g., corresponding dielectrics 221 in stack 201) can be removed by accessing those dielectrics through opening 554, such as during a replacement gate process, to form spaces in place of the removed dielectrics. For example, the removal of the dielectrics can form a structure similar to the structure in FIG. 2O. The termination of opening 554 at prongs 573 and at recessed surface 574, as shown in FIG. 4C, can prevent removal material in opening 554 from flowing around dielectric liner 549 and forming a path for extraneous metal could cause an electrical short between access lines formed from the metal on either side of opening 554, such as between access lines corresponding to group 218-1 and access lines corresponding to group 218-2 in FIG. 2L.

Figure 5D:
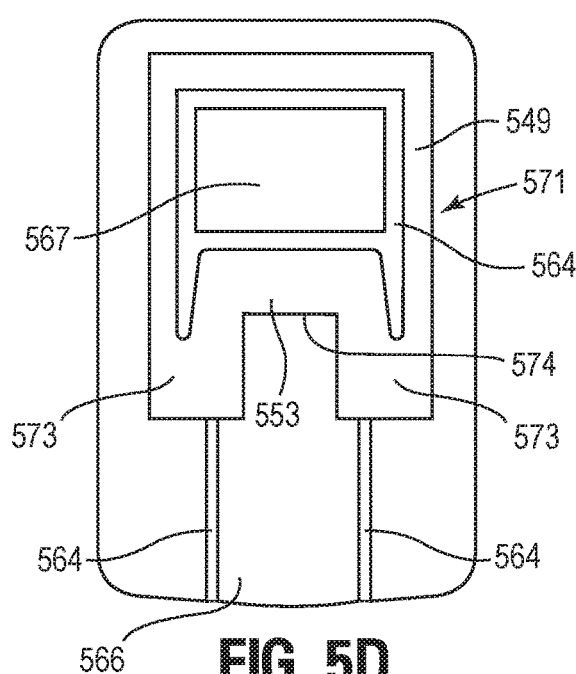

FIG. 5D is a cross-section corresponding to a processing stage following the processing stage of FIG. 5C in accordance with a number of embodiments of the present disclosure. FIG. 5D can correspond to the cross-section of FIG. 2R viewed along line R-R in FIG. 2Q. For example, the cross-section in FIG. 5D can be below the dielectric 551 and below the upper ends dielectric liner 549.

During the processing stage corresponding to FIG. 5D, opening 554 and the opening 556 lined with dielectric liner 549 can be lined with a dielectric liner 564, such as an oxide liner. For example, dielectric liner 564 can be formed adjacent to dielectric liner 549 in opening 556. Dielectric liner 549 can wrap completely around dielectric liner 564 below the upper ends of the dielectric liner 549 and below dielectric 551.

Subsequently, a semiconductor structure 566 (e.g., of polysilicon) is formed in the opening 554 lined with liner 564 by forming semiconductor structure 566 adjacent to that liner 564. A semiconductor structure 567 (e.g., of polysilicon) is formed in the opening 556 lined with liner 564 by forming semiconductor structure 567 adjacent to that liner 564. Dielectric liner 564 can wrap completely around semiconductor structure 567 below the upper ends of the dielectric liner 564 and below dielectric 551. The structure including a dielectric liner 564 wrapped around semiconductor structure 567 and dielectric liner 549 wrapped around dielectric liner 564 can be a termination structure 571. For example, the dielectric liner 564 on either side of semiconductor structure 566 and portions of semiconductor structure 566 can terminate at prongs 573. A remaining portion of semiconductor structure 566 can terminate at recessed surface 574. In some examples, a structure dielectric liner 564 on either side of semiconductor structure 566 can pass through a stack of dielectrics alternating with layers of metal, such as stack dielectrics 220 alternating with layers of metal 263 (FIG. 2S), between blocks of memory cells, such as between blocks 268-1 and 268-1 and between blocks 268-2 and 268-3 (FIG. 2P).

FIG. 6A is a top view corresponding to a particular stage of processing associated with forming a stacked memory array in accordance with a number of embodiments of the present disclosure. An opening having a perimeter 641 can be formed through a stack 601 of alternating dielectrics in a manner similar to forming openings 240, as previously described in conjunction with FIGS. 2A and 2B. For example, stack 601 can be stack 201. The opening can replace an opening 240 and can be formed in the region 214 of stack 201 concurrently with forming contact openings 238.

The opening can be lined with a dielectric liner 649, such as an oxide liner, that can have a pair of separated prongs 673 that can extend (e.g., protrude) into stack 601 away from the lined opening. Prongs 673 can extend toward a memory-cell region, such as memory cell region 202 in FIG. 2A. For example, dielectric liner 649 can have an inverted V-shaped sidewall 653 that can be analogous to sidewall 253 of dielectric liner 249 and an opposing straight sidewall 669. Prongs 673 can be tapered in a direction toward memory-cell region. Dielectric liner 649 can be formed concurrently with the dielectric liners 248 in FIGS. 2E and 2G, for example.

A conductive structure, such as a metal structure 652 (e.g., of tungsten), can be formed in the lined opening adjacent to liner 649 to form a termination structure 647 that includes dielectric liner 649 surrounding metal structure 652. For example, each of the termination structures 247-1 and 247-2 in FIGS. 2E and 2F can be replaced by a respective termination structure 647. Metal structure 652 can be formed concurrently with the metal structures 260 in FIGS. 2E and 2G, for example. As such, termination structure 647 can be formed concurrently with contacts, such as contacts 204 in FIGS. 2E and 2G.

FIG. 6B is a top-down view of a processing stage following the processing stage corresponding to FIG. 6A in accordance with a number of embodiments of the present disclosure. A dielectric 651, such as oxide, can be formed over stack 601 and an upper surface of termination structure 647. For example, dielectric 651 can be formed over an upper surface 672 of metal structure 652.

An opening 654, such as a slot or slit, can be formed through dielectric 651 and stack 601. For example, opening 654 can be an opening 264 in FIGS. 2H to 2K and can be formed between groups of semiconductor structures, such as between the groups 218-1 and 218-2 of semiconductor structures, so that the opening exposes at least a portion of the upper surface 672 of metal structure 652. For example, a portion of opening 654 can extend over a portion of metal structure 652 and terminate there. A remaining portion of opening 654 can terminate at sidewall 653 below upper surface 672 and below dielectric 651 in a manner similar to opening 264 terminating at sidewall 253 in FIGS. 2I and 2J. The inverted V-shaped sidewall 653 can compensate for the tapering of dielectric liner 649 due the formation of opening 654, as previously described in conjunction with FIG. 2I, and can reduce the likelihood of opening 654 passing through sidewall 653 adjacent to the top of metal structure 652 due to the tapering effect.

FIG. 6C is a cross-section corresponding to a processing stage following the processing stage of FIG. 6B in accordance with a number of embodiments of the present disclosure. FIG. 6C can correspond to the cross-section of FIG. 2N viewed along line N-N in FIG. 2M. For example, the cross-section in FIG. 6C can be below the dielectric 651 and below the upper ends dielectric liner 649.

During the processing stage corresponding to FIG. 6C, metal structure 652 is removed to form an opening 656, leaving dielectric liner 649. For example, the formation of opening 656 can be analogous the formation of opening 256, as discussed previously in conjunction with FIGS. 2L to 2N. For example, metal structure 652 can be accessed at its exposed upper surface 672 through opening 654. Dielectric liner 649 can form a termination structure that terminates opening 654. In some examples, each of the openings 254 in FIG. 2L can terminate at a respective dielectric liner 649.

Note that portions of opening 654 can terminate at an inverted V-shaped surface 674 of sidewall 653. For example, dielectric liner 649 can have an inverted V-shaped recess, bounded inverted V-shaped surface 674, in which opening 654 can terminate. For example, the inverted V-shaped recess can include a portion of stack 601 and can be between prongs 672. Note that sidewall 669 can be transverse to opening 654.

Subsequently, dielectrics in stack 601, (e.g., corresponding dielectrics 221 in stack 201) can be removed by accessing those dielectrics through opening 654, such as during a replacement gate process, to form spaces in place of the removed dielectrics. For example, the removal of the dielectrics can form a structure similar to the structure in FIG. 2O. The termination of opening 654 at prongs 573 and at inverted V-shaped surface 674, as shown in FIG. 6C, can prevent removal material in opening 654 from flowing around dielectric liner 649 and forming a path for extraneous metal could cause an electrical short between access lines formed from the metal on either side of opening 654, such as between access lines corresponding to group 218-1 and access lines corresponding to group 218-2 in FIG. 2L.

FIG. 6D is a cross-section corresponding to a processing stage following the processing stage of FIG. 6C in accordance with a number of embodiments of the present disclosure. FIG. 6D can correspond to the cross-section of FIG. 2R viewed along line R-R in FIG. 2Q. For example, the cross-section in FIG. 6D can be below the dielectric 661 and below the upper ends dielectric liner 649.

During the processing stage corresponding to FIG. 6D, opening 654 and the opening 656 lined with dielectric liner 649 can be lined with a dielectric liner 664, such as an oxide liner. For example, dielectric liner 664 can be formed adjacent to dielectric liner 649 in opening 656. Dielectric liner 649 can wrap completely around dielectric liner 664 below the upper ends of the dielectric liner 649 and below dielectric 651.

Subsequently, a semiconductor structure 666 (e.g., of polysilicon), is formed in the opening 654 lined with liner 664 by forming semiconductor structure 666 adjacent to that liner 664. A semiconductor structure 667 (e.g., of polysilicon) is formed in the opening 656 lined with liner 664 by forming semiconductor structure 667 adjacent to that liner 664. Dielectric liner 664 can wrap completely around semiconductor structure 667 below the upper ends of the dielectric liner 664 and below dielectric 661. The structure including a dielectric liner 664 wrapped around semiconductor structure 667 and dielectric liner 649 wrapped around dielectric liner 664 can be a termination structure 671. For example, semiconductor structure 666 and the dielectric liner 664 on either side of semiconductor structure 666 can terminate at the inverted V-shaped surface 674 of sidewall 653. Note that sidewall 669 can be transverse to semiconductor structure 666 and the dielectric liner 664 on either side of semiconductor structure 666. In some examples, a structure with a semiconductor structure 666 adjacent to dielectric liner 664 can pass through a stack of dielectrics alternating with layers of metal, such as stack dielectrics 220 alternating with layers of metal 263 (FIG. 2S), between blocks of memory cells, such as between blocks 268-1 and 268-1 and between blocks 268-2 and 268-3 (FIG. 2P).

Figure 7:
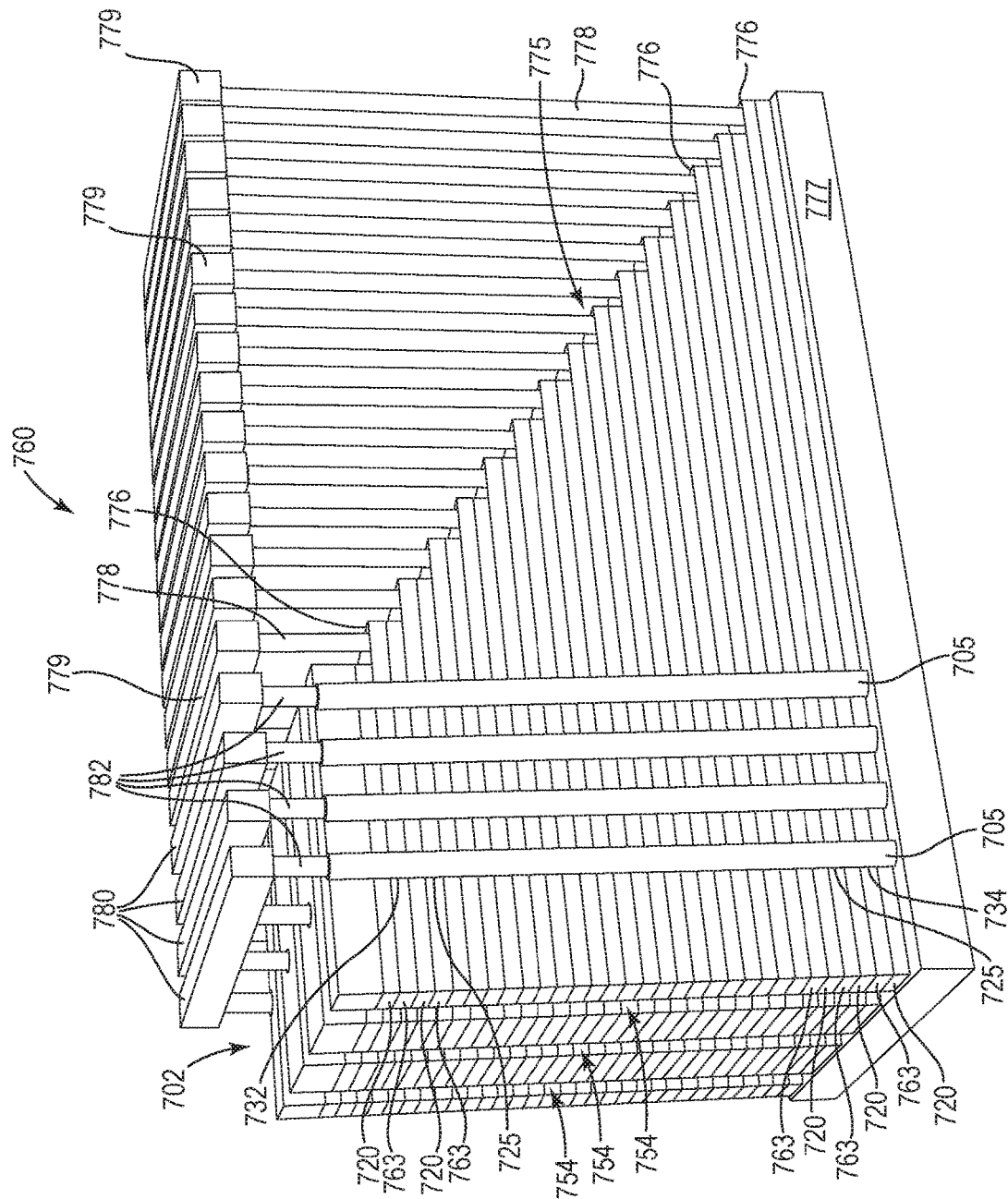
FIG. 7 illustrates a stacked memory array in accordance a number of embodiments of the present disclosure.

FIG. 7 illustrates a stacked memory array, such as stacked memory array 760, in accordance a number of embodiments of the present disclosure. For example, array 760 can include a region 702 (e.g., a memory-cell region) that can correspond to region 202. Array 760 includes a stair-step structure 775 adjacent to region 702.

Array 760 can include a stack of dielectrics 720 alternating with levels of metal 763. Semiconductor structures 705 pass through the stack in region 702 and terminate at an upper surface of or in a semiconductor 777 that can include semiconductor 223 and that can be over metal silicide 224. A select transistor 732 can be adjacent to each semiconductor structure 705 at a level corresponding to the uppermost level of metal 763, and a select transistor 734 can be adjacent to each semiconductor structure 705 at a level corresponding to the lowermost level of metal 763. Memory cells 725 can be adjacent to each semiconductor structure 705 at levels corresponding to the levels of metal 763 between the uppermost and lowermost levels of metal 763. For example, semiconductor structures 705, dielectrics 720, semiconductor 723, and metal 763 can be as previously described for respective semiconductor structures 205, dielectrics 220, semiconductor 223, and metal 263 shown in FIGS. 2A to 2S.

The uppermost and lowermost levels of metal 763 can be control lines that form or are coupled to control gates of select transistors 732 and 734, respectively. The levels of metal 763 between the uppermost and lowermost levels of metal 763 can be access lines that form or are coupled to control gates of memory cells 725.

Stair-step structure 775 includes steps 776 that can each include a respective level of metal 763 over an adjacent dielectric 720. A respective contact 778 is coupled to the level of metal 763 of each respective step 776. Respective contacts 778 are coupled to activation (e.g., access) circuitry by respective lines 779. Data lines 780 are coupled to semiconductor structures 705 by data line contacts 782.

Openings 754 are formed through the stack. Openings 754 can be as previously described for openings 254. Openings 754 can terminate at termination structures, such as dielectric liners 249, 349, 449, 559, or 649, in a manner similar to (e.g., the same as) as previously described for openings 254, 354, 454, 554, or 654.

Figure 8:
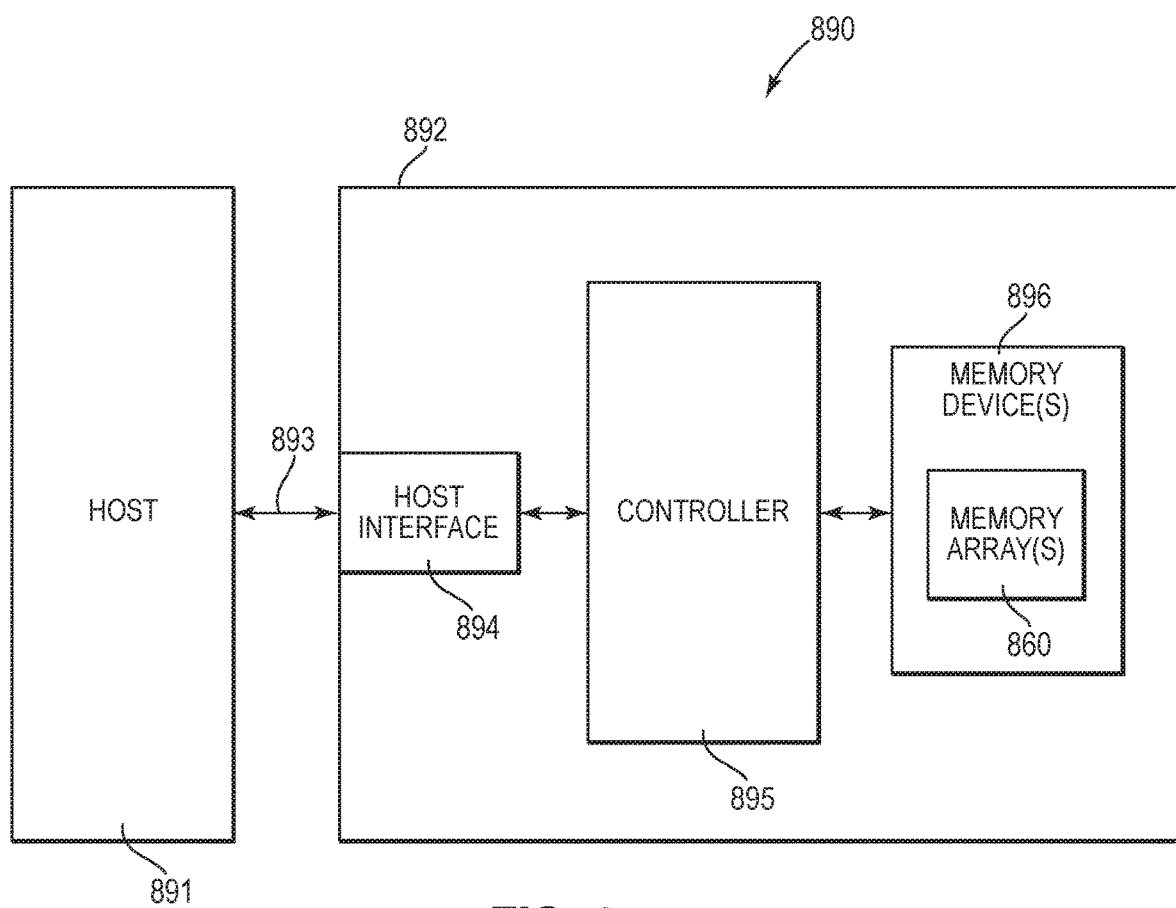
FIG. 8 is a block diagram of an apparatus in accordance a number of embodiments of the present disclosure.

FIG. 8 is a block diagram of an apparatus in accordance a number of embodiments of the present disclosure. For example, the apparatus can be an electronic system, such as a computing system 890. Computing system 890 can include a memory system 892 that can be a solid-state drive (SSD), for instance. Memory system 892 can include a host interface 894, a controller 895, such as a processor and/or other control circuitry, and a number of memory devices 896, such as NAND flash devices, that provide a storage volume for the memory system 892. A memory device 896 can have a number of memory arrays 860, such as memory array 260 shown in FIG. 2P or memory array 760 shown in FIG. 7.

Controller 895 can be coupled to the host interface 894 and to the number of memory devices 896 via one or more channels and can be used to transfer data between the memory system 892 and a host 891. Host 891 can be coupled to the host interface 894 by a communication channel 893. Host 891 can be a host system such as a personal laptop computer, a desktop computer, a digital camera, a mobile telephone, or a memory card reader, among various other types of hosts.

The term semiconductor can refer to, for example, a layer of material, a wafer, or a substrate, and includes any base semiconductor structure. "Semiconductor" is to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a semiconductor in the following description, previous process steps may have been utilized to form regions/junctions in the base semiconductor structure, and the term semiconductor can include the underlying layers containing such regions/junctions.

As used herein, "a number of" something can refer to one or more of such things. For example, a number of memory cells can refer to one or more memory cells. A "plurality" of something intends two or more. As used herein, multiple acts being performed concurrently refers to acts overlapping, at least in part, over a particular time period. As used herein, the term "coupled" may include electrically coupled, directly coupled, and/or directly connected with no intervening elements (e.g., by direct physical contact) or indirectly coupled and/or connected with intervening elements. The term coupled may further include two or more elements that co-operate or interact with each other (e.g., as in a cause and effect relationship). It should be recognized the term parallel takes into account variations from "exactly" parallel due to routine manufacturing and/or assembly variations.

The figures herein follow a numbering convention in which the first digit or digits correspond to the drawing figure number and the remaining digits identify an element or component in the drawing. Similar elements or components between different figures may be identified by the use of similar digits. As will be appreciated, elements shown in the various embodiments herein can be added, exchanged, and/or eliminated so as to provide a number of additional embodiments of the present disclosure. In addition, the proportion and the relative scale of the elements provided in the figures are intended to illustrate various embodiments of the present disclosure and are not to be used in a limiting sense.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

What is claimed is:

1. A method of forming a stacked memory array, comprising:
    forming a stack of alternating first and second dielectrics;
    forming a termination structure through the stack, the termination structure comprising a dielectric liner around a conductor;
    forming a set of contacts concurrently with forming the termination structure;
    forming a third dielectric over an upper surface of the stack and an upper surface of the termination structure;
    forming a first opening through the third dielectric and the stack between first and second groups of semiconductor structures and through the third dielectric over an upper surface of the termination structure so that the first opening exposes an upper surface of the conductor; and
    removing the conductor from the termination structure to form a second opening lined with the dielectric liner.

2. The method of claim 1, wherein removing the conductor from the termination structure comprises accessing the conductor through the first opening.

3. The method of claim 1, wherein first opening terminates at the dielectric liner.

4. The method of claim 1, further comprising, after removing the conductor, removing the first dielectrics from a second region of the stack comprising the first and second groups of semiconductor structures by accessing the first dielectrics through the first opening.

5. The method of claim 4, wherein
    the conductor is a first conductor;
    removing the first dielectrics from the second region forms spaces corresponding the removed first dielectrics; and
    the method further comprises forming a second conductor in the spaces by supplying the second conductor through the first opening.

6. The method of claim 1, wherein the dielectric liner is a first dielectric liner, the method further comprising:
    lining the second opening with a second dielectric liner by forming the second dielectric liner adjacent to the first dielectric liner; and
    lining the first opening with the second dielectric liner.

7. The method of claim 6, wherein
    the semiconductor structures are first semiconductor structures; and
    the method further comprises:
    forming a second semiconductor structure in the first opening adjacent to the second liner; and
    forming a third semiconductor structure in the second opening adjacent to the second liner.

8. The method of claim 7, wherein
    forming the second semiconductor structure in the first opening comprises forming polysilicon in the first opening; and
    forming the third semiconductor structure in the second opening comprises forming polysilicon in the second opening.

9. The method of claim 7, wherein
    the termination structure is a first termination structure; and
    forming the second semiconductor structure in the first opening forms a second termination structure that terminates the third semiconductor structure and that comprises the first and second dielectric liners and the second semiconductor structure.

10. The method of claim 6, wherein forming the first and second dielectric liners each comprises forming oxide liners.

11. The method of claim 1, wherein the exposed portion of the upper surface of the conductor has a rectangular shape.

12. The method of claim 11, wherein the rectangular shape comprises:
   short sides that are transverse to and wider than the first opening; and
   long sides that are parallel the first opening.

13. The method of claim 1, wherein
   forming the stack comprises forming the stack over a semiconductor; and
   forming the termination structure comprises forming the termination structure over a conductive plug in the semiconductor.

14. A method of forming a stacked memory array, comprising:
   forming a stack of alternating first and second dielectrics;
   forming a first opening through the stack;
   lining the first opening with a dielectric liner that comprises a tab;
   forming a conductor in the lined first opening adjacent to the liner;
   forming a third dielectric over an upper surface of stack and over an upper surface of the conductor;
   forming a second opening through the third dielectric and the stack between first and second groups of semiconductor structures and through the third dielectric over the upper surface of the conductor so that the first opening exposes the upper surface of the conductor and so that the tab extends into the opening; and
   removing the conductor to form a third opening lined with the dielectric liner.

15. The method of claim 14, wherein at least a portion of the second opening terminates at the tab.

16. The method of claim 14, wherein the tab has a rectangular profile.

17. The method of claim 14, wherein the tab has a triangular profile.

18. The method of claim 14, further comprising, after removing the conductor, removing the first dielectrics from a region of the stack comprising the first and second groups of semiconductor structures by accessing the first dielectrics through the second opening.

19. The method of claim 14, wherein the dielectric liner is a first dielectric liner, the method further comprising:
   lining the third opening with a second dielectric liner by forming the second dielectric liner adjacent to the first dielectric liner; and
   forming a semiconductor in the third opening adjacent to the second dielectric liner.

20. The method of claim 19, further comprising forming a semiconductor in the second opening so that the tab the first dielectric liner extends into the semiconductor in the second opening.

21. A method of forming a stacked memory array, comprising:
   forming a stack of alternating first and second dielectrics;
   forming a first opening through the stack;
   lining the first opening with a dielectric liner that comprises first and second prongs;
   forming a conductor in the lined first opening adjacent to the dielectric liner;
   forming a third dielectric over an upper surface of stack and over an upper surface of the conductor;
   forming a second opening through the third dielectric and the stack between first and second groups of semiconductor structures and through the third dielectric over the upper surface of the conductor so that the first opening exposes the upper surface of the conductor and so that at least a portion of the opening is between the first and second prongs; and
   removing the conductor to form a third opening lined with the dielectric liner.

22. The method of claim 21, wherein the first and second prongs have a rectangular profile.

23. The method of claim 21, wherein the first and second prongs are tapered.

24. The method of claim 21, wherein the dielectric liner is a first dielectric liner, the method further comprising:
   lining the third opening with a second dielectric liner by forming the second dielectric liner adjacent to a remaining portion of the first dielectric liner;
   lining the second opening with the second dielectric liner; and
   forming a semiconductor in the second and third openings lined with the second dielectric liner.

* * * * *